US010761931B2

(12) United States Patent
Goyal et al.

(10) Patent No.: US 10,761,931 B2
(45) Date of Patent: Sep. 1, 2020

(54) INLINE RELIABILITY CODING FOR STORAGE ON A NETWORK

(71) Applicant: Fungible, Inc., Santa Clara, CA (US)

(72) Inventors: Rajan Goyal, Saratoga, CA (US); Abhishek Kumar Dikshit, Fremont, CA (US)

(73) Assignee: Fungible, Inc., Santa Clara, CA (US)

( * ) Notice: Subject to any disclaimer, the term of this patent is extended or adjusted under 35 U.S.C. 154(b) by 17 days.

(21) Appl. No.: 16/169,736

(22) Filed: Oct. 24, 2018

(65) Prior Publication Data
US 2020/0133771 A1    Apr. 30, 2020

(51) Int. Cl.
| | |
|---|---|
| G06F 11/10 | (2006.01) |
| H03M 13/15 | (2006.01) |
| G06F 17/16 | (2006.01) |
| H03M 13/37 | (2006.01) |
| H03M 13/00 | (2006.01) |

(52) U.S. Cl.
CPC .......... G06F 11/1076 (2013.01); G06F 17/16 (2013.01); H03M 13/154 (2013.01); H03M 13/1515 (2013.01); H03M 13/373 (2013.01); H03M 13/3761 (2013.01); H03M 13/6516 (2013.01)

(58) Field of Classification Search
CPC ............................ G06F 11/1076; G06F 17/16; H03M 13/1515; H03M 13/154; H03M 13/373; H03M 13/3761; H03M 13/6516
See application file for complete search history.

(56) References Cited

U.S. PATENT DOCUMENTS

| | | |
|---|---|---|
| 8,156,306 B1 | 4/2012 | Raizen et al. |
| 9,065,482 B1 | 6/2015 | Johnston et al. |
| 2003/0084020 A1 | 5/2003 | Shu |

(Continued)

FOREIGN PATENT DOCUMENTS

EP    2750018 A2    7/2014

OTHER PUBLICATIONS

Huang et al., "Erasure Coding in Windows Azure Storage," Microsoft Corporation, USENIX ATC'12 Proceedings of the 2012 USENIX conference on Annual Technical Conference, Jun. 13-15, 2012, 12 pp.

(Continued)

*Primary Examiner* — Guy J Lamarre
(74) *Attorney, Agent, or Firm* — Shumaker & Sieffert, P.A.

(57) ABSTRACT

This disclosure describes a programmable device, referred to generally as a data processing unit, having multiple processing units for processing streams of information, such as network packets or storage packets. This disclosure also describes techniques that include enabling data durability coding on a network. In some examples, such techniques may involve storing data in fragments across multiple fault domains in a manner that enables efficient recovery of the data using only a subset of the data. Further, this disclosure describes techniques that include applying a unified approach to implementing a variety of durability coding schemes. In some examples, such techniques may involve implementing each of a plurality of durability coding and/or erasure coding schemes using a common matrix approach, and storing, for each durability and/or erasure coding scheme, an appropriate set of matrix coefficients.

18 Claims, 16 Drawing Sheets

(56) References Cited

U.S. PATENT DOCUMENTS

| | | |
|---|---|---|
| 2010/0246663 A1 | 9/2010 | Citta et al. |
| 2010/0332401 A1 | 12/2010 | Prahlad et al. |
| 2013/0031446 A1 | 1/2013 | Kamiya |
| 2014/0324793 A1 | 10/2014 | Glazemakers |
| 2014/0380126 A1* | 12/2014 | Yekhanin ............ G06F 11/1076 714/766 |
| 2016/0077746 A1 | 3/2016 | Muth et al. |
| 2016/0239384 A1 | 8/2016 | Slik et al. |
| 2016/0314043 A1* | 10/2016 | Slik .................... G06F 11/1076 |
| 2017/0090765 A1* | 3/2017 | Balinski ................ G06F 3/0604 |
| 2017/0187398 A1 | 6/2017 | Trusov et al. |
| 2017/0250712 A1 | 8/2017 | Chiu et al. |
| 2018/0004600 A1 | 1/2018 | Danilov et al. |
| 2018/0287965 A1 | 10/2018 | Sindhu et al. |
| 2018/0293168 A1 | 10/2018 | Noureddine et al. |
| 2018/0331784 A1 | 11/2018 | Chiu et al. |
| 2019/0012278 A1 | 1/2019 | Sindhu et al. |
| 2019/0013965 A1 | 1/2019 | Sindhu et al. |
| 2019/0104206 A1 | 4/2019 | Goel et al. |
| 2019/0104207 A1 | 4/2019 | Goel et al. |
| 2019/0158428 A1 | 5/2019 | Gray et al. |
| 2019/0188079 A1 | 6/2019 | Kohli |
| 2019/0243765 A1 | 8/2019 | Noureddine et al. |
| 2019/0370170 A1* | 12/2019 | Oltean ................... G06F 3/065 |

OTHER PUBLICATIONS

Huang et al., "Pyramid Codes: Flexible Schemes to Trade Space for Access Efficiency in Reliable Data Storage Systems," Microsoft Corporation, 2007 (Applicant points out, in accordance with MPEP 609.04(a), that the year of publication, 2007, is sufficiently earlier than the effective U.S. filing date, so that the particular month of publication is not in issue.) 14 pp.

Schroeder et al., "Flash Reliability in Production: The Expected and the Unexpected," 14th USENIX Conference on File and Storage Technologies (FAST '16), Feb. 22-25, 2016, pp. 67-80.

U.S. Appl. No. 16/265,606, filed Feb. 1, 2019, by Goyal et al.

International Search Report and Written Opinion of International Application No. PCT/US2019/057869, dated Apr. 23, 2020, 25 pages.

* cited by examiner

INLINE RELIABILITY CODING FOR STORAGE ON A NETWORK

TECHNICAL FIELD

This disclosure relates to processing packets of information, for example, in the fields of networking and storage

BACKGROUND

In a typical cloud-based data center, a large collection of interconnected servers provides computing and/or storage capacity for execution of various applications. For example, a data center may comprise a facility that hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

Many devices within a computer network, e.g., storage/compute servers, firewalls, intrusion detection devices, switches, routers or other network attached devices, often use general purpose processors, including multi-core processing systems, to process data, such as network or storage data. However, general purpose processing cores and multi-processing systems are normally not designed for high-capacity network and storage workloads of modern network and can be relatively poor at performing packet stream processing. Further, in a large scale fabric, storage systems may become unavailable from time to time, due to hardware error, software error, or another reason. Data durability procedures may be employed to ensure access to critical data.

SUMMARY

In general, this disclosure describes a programmable device, referred to generally as a data processing unit, having multiple processing units for processing streams of information, such as network packets or storage packets. In some examples, the processing units may be processing cores, and in other examples, the processing units may be virtual processors, hardware threads, hardware blocks, or other sub-processing core units. As described herein, the data processing unit includes one or more specialized hardware accelerators configured to perform acceleration for various data-processing functions.

This disclosure also describes techniques that include enabling data durability (or data reliability) coding on a network. In some examples, such techniques may involve the data processing unit storing data in fragments across multiple fault domains in a manner that enables efficient recovery of the data even if only a subset of the data is available. Data fragments may be generated, by data durability circuitry included within the data processing unit, using one of a variety of durability or erasure coding schemes that enable recovery of data where one or more fragments are unavailable due to software or hardware error or for another reason, such as maintenance. Data fragments may also be stored, by the data processing unit, across multiple fault domains on a network to help reduce the chance that multiple fragments of data are unavailable. Techniques in accordance with one or more aspects of the present disclosure may enable inline data recovery of data in the data path of the storage with low or very low latency, while requiring significantly less storage than a simple data replication scheme. In some examples, one or more hosts or server devices may effectively offload, to one or more data processing units, some or all of the computing operations that might otherwise be performed by those hosts or server devices for purposes of data durability and/or reliability. By offloading the performance of such operations to data processing units, one or more of the hosts or server devices may be available to perform other tasks and/or operate more efficiently. In some examples, data processing units may, from the perspective of the hosts and/or server devices, perform data durability operations (data encoding, data decoding, and recovery) on network traffic transparently.

This disclosure further describes techniques that include applying a unified approach to implementing a variety of durability coding schemes. In some examples, such techniques may involve implementing each of a plurality of durability coding and/or erasure coding schemes using a common matrix approach, and storing, for each durability and/or erasure coding scheme, an appropriate set of matrix coefficients. Such techniques may simplify the logic required to implement multiple durability and/or erasure coding schemes. Further, such techniques may provide an effective software abstraction layer, enabling common configurations to be used to implement a variety of schemes, thereby providing reliability, configurability, and flexibility.

In one example, this disclosure describes a method comprising generating, by a device and from a set of data, a plurality of data fragments; storing, by the device, the plurality of data fragments on a network, wherein at least some of the plurality of data fragments is stored within a different fault domain on the network; receiving, by the device and from a computing device, a request to access at least a portion of the set of data; determining, by the device, that one or more of the plurality of data fragments is not available on the network; identifying, by the device, a plurality of available data fragments, wherein the plurality of available data fragments is a subset of the plurality of data fragments; retrieving, by the device, each of the plurality of available data fragments over the network; generating, by the device, a reconstructed set of data from the available data fragments; and responding to the request by outputting, by the device, the reconstructed data.

In another example, this disclosure describes a method comprising identifying a reliability scheme from among a plurality of available reliability schemes, determining, based on the reliability scheme, a coefficient matrix for implementing the reliability scheme; storing the coefficient matrix; receiving data to be stored; producing, from the data and by applying the coefficient matrix to the data, parity data; receiving a request for the data; and generating the data based on the parity data, wherein generating the data includes generating the data by applying the coefficient matrix.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
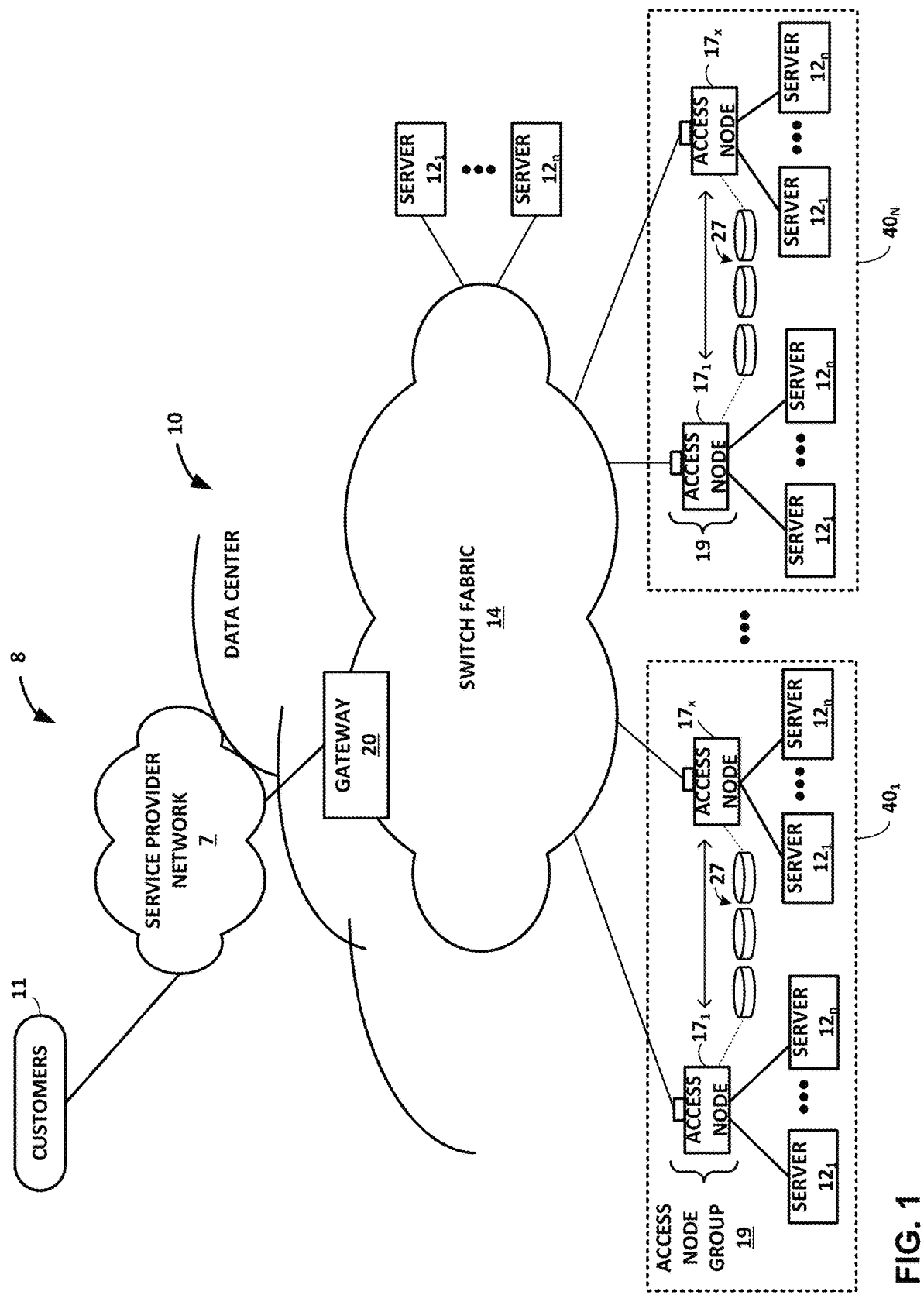
FIG. 1 is a block diagram illustrating an example system 8 including one or more network devices configured to efficiently process a series of work units in a multiple core processor system, in accordance with the techniques of this disclosure.

FIG. 1 is a block diagram illustrating an example system 8 including one or more network devices configured to efficiently process a series of work units in a multiple core processor system. As described herein, techniques for performing data durability coding may provide technical benefits that include enabling inline data recovery in a flexible and storage-efficient manner. Access nodes may also be referred to as data processing units (DPUs), or devices including DPUs, in this disclosure. In the example of FIG. 1, various data structures and processing techniques are described with respect to access nodes 17 within a data center 10. Other devices within a network, such as routers, switches, servers, firewalls, gateways and the like, having multiple core processor systems may readily be configured to utilize the data processing techniques described herein.

Data center 10 represents an example of a system in which various techniques described herein may be implemented. In general, data center 10 provides an operating environment for applications and services for customers 11 coupled to the data center by service provider network 7 and gateway device 20. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 14. In some examples, servers 12 are arranged into multiple different server groups, each including any number of servers up to, for example, n servers $12_1$-12N. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, each of servers 12 is coupled to switch fabric 14 by an access node 17 for processing streams of information, such as network packets or storage packets. In example implementations, access nodes 17 may be configurable to operate in a standalone network appliance having one or more access nodes. For example, access nodes 17 may be arranged into multiple different access node groups 19, each including any number of access nodes up to, for example, x access nodes $17_1$-17X. In other examples, each access node may be implemented as a component (e.g., electronic chip) within a device, such as a compute node, application server, storage server, and may be deployed on a motherboard of the device or within a removable card, such as a storage and/or network interface card.

In general, each access node group 19 may be configured to operate as a high-performance I/O hub designed to aggregate and process network and/or storage I/O for multiple servers 12. As described above, the set of access nodes 17 within each of the access node groups 19 provide highly-programmable, specialized I/O processing circuits for handling networking and communications operations on behalf of servers 12. In addition, in some examples, each of access node groups 19 may include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory.

Each access node group 19, including its set of access nodes 17 and storage devices 27, and the set of servers 12 supported by the access nodes 17 of that access node group 19 may be referred to herein as a network storage compute unit (NCSU) 40. Illustrated in FIG. 1 are NCSU 40-1 through NCSU 40-N, which represent any number of NCSUs. In some examples, data center 10 may include many NCSUs, and multiple NCSUs 40 may be organized into logical racks or physical racks within data center 10. For example, in some implementations, two NCSUs may compose a logical rack, and four NCSUs may compose a physical rack. Other arrangements are possible.

In a large scale fabric, storage systems represented by one or more access node groups 19 or NCSUs 40 may become unavailable from time to time. Failure rates of storage systems are often significant, even if single component failure rates are quite small. Further, storage systems may become unavailable for reasons other than a software error or hardware malfunction, such as when a storage system or other device is being maintained or the software on such a device is being modified or upgraded. Accordingly, as further described herein, data durability procedures may be employed to ensure access to critical data stored on a network when one or more storage systems are unavailable.

In some examples, one or more hardware or software subsystems may serve as a failure domain or fault domain for storing data across data center 10. For instance, in some examples, a failure domain may be chosen to include hardware or software subsystems within data center 10 that are relatively independent, such that a failure (or unavailability) of one such subsystem is relatively unlikely to be correlated with a failure of another such subsystem. Storing data fragments in different failure domains may therefore reduce the likelihood that more than one data fragment will be lost or unavailable at the same time. In some examples, a failure domain may be chosen at the NCSU level, such that each NCSU represents a different failure domain. In other examples, failure domains may be chosen more broadly, so that a failure domain encompasses more than one NCSU so that a failure domain may encompass a logical or physical rack comprising multiple NCSUs. Broader or narrower definitions of a failure domain may also be appropriate in various examples, depending on the nature of the network 8, data center 10, or subsystems within data center 10.

As further described herein, in one example, each access node 17 is a highly programmable I/O processor specially designed for offloading certain functions from servers 12. In one example, each access node 17 includes a number of internal processor clusters, each including two or more processing cores and equipped with hardware engines that offload cryptographic functions, compression and regular expression (RegEx) processing, data durability functions, data storage functions and networking operations. In this way, each access node 17 includes components for fully implementing and processing network and storage stacks on behalf of one or more servers 12. In addition, access nodes 17 may be programmatically configured to serve as a security gateway for its respective servers 12, freeing up the processors of the servers to dedicate resources to application workloads. In some example implementations, each access node 17 may be viewed as a network interface subsystem that implements full offload of the handling of data packets (with, in some examples, zero copy in server memory) and storage acceleration for the attached server systems. In one example, each access node 17 may be implemented as one or more application-specific integrated circuit (ASIC) or other hardware and software components, each supporting a subset of the servers. In accordance with the techniques of this disclosure, any or all of access nodes 17 may include a data durability or similar accelerator unit. That is, one or more computing devices may include an access node including one or more data durability, data reliability, and/or erasure coding accelerator units, according to the techniques of this disclosure.

The data durability accelerator unit of the access node, according to the techniques of this disclosure, may be configured to store data in fragments across multiple fault domains in a manner that enables efficient recovery of the data using or based on a subset of the data fragments. When storing data, the data durability accelerator unit may encode data using any of a variety of data durability or erasure coding schemes that enable recovery of data when one or more of such fragments are unavailable due to software or hardware error, or for another reason, such as modifications (e.g., software upgrades) being performed on the storage unit where a data fragment is being stored. Further, the data durability accelerator unit may provide a flexible and/or configurable data durability system by applying a unified approach to implementing a variety of data durability coding schemes. In some examples, the data durability accelerator may implement multiple data durability coding schemes or algorithms through a common matrix approach. In such an example, each data durability scheme or algorithm may be selected or configured through a different coefficient matrix. A common algorithm may be applied that implements, based on values in the selected or configured coefficient matrix, a different data durability algorithm.

In the example of FIG. 1, each access node 17 provides connectivity to switch fabric 14 for a different group of servers 12 and may be assigned respective IP addresses and provide routing operations for the servers 12 coupled thereto. Access nodes 17 may interface with and utilize switch fabric 14 so as to provide full mesh (any-to-any) interconnectivity such that any of servers 12 may communicate packet data for a given packet flow to any other of the servers using any of a number of parallel data paths within the data center 10. In addition, access nodes 17 described herein may provide additional services, such as storage (e.g., integration of solid-state storage devices), security (e.g., encryption), acceleration (e.g., compression), data reliability (e.g., erasure coding), I/O offloading, and the like. In some examples, one or more of access nodes 17 may include storage devices, such as high-speed solid-state drives or rotating hard drives, configured to provide network accessible storage for use by applications executing on the servers. More details on the data center network architecture and interconnected access nodes illustrated in FIG. 1 are available in U.S. Provisional Patent Application No. 62/514,583, filed Jun. 2, 2017, entitled "Non-Blocking Any-to-Any Data Center Network with Packet Spraying Over Multiple Alternate Data Paths,", the entire content of which is incorporated herein by reference.

Two example architectures of access nodes 17 are described below with respect to FIG. 2, FIG. 3, and FIG. 4. With respect to some or all of such examples, the architecture of each access node 17 comprises a multiple core processor system that represents a high performance, hyper-converged network, storage, and data processor and input/ output hub. The architecture of each access node 17 is optimized for high performance and high efficiency stream processing.

A stream is defined as an ordered, unidirectional sequence of computational objects that can be of unbounded or undetermined length. In a simple example, a stream originates in a producer and terminates at a consumer, is operated on sequentially, and is flow-controlled. In some examples, a stream can be defined as a sequence of stream fragments, each representing a portion of data communicated by a stream. In one example, a stream fragment may include a memory block contiguously addressable in physical address space, an offset into that block, and a valid length. Streams can be discrete, such as a sequence of packets received from a network, or continuous, such as a stream of bytes read from a storage device. A stream of one type may be transformed into another type as a result of processing. Independent of the stream type, stream manipulation requires efficient fragment manipulation. An application executing on one of access nodes 17 may operate on a stream in three broad ways: the first is protocol processing, which consists of operating on control information or headers within the stream; the second is payload processing, which involves significant accessing of the data within the stream; and third is some combination of both control and data access.

Stream processing is a specialized type of conventional general-purpose processing supporting specialized limitations with regard to both access and directionality. Processing typically only accesses a limited portion of the stream at any time, called a "window," within which it may access random addresses. Objects outside of the window are not accessible through a streaming interface. In contrast, general purpose processing views the whole memory as randomly accessible at any time. In addition, stream processing generally progresses in one direction, called the forward direction. These characteristics make stream processing amenable to pipelining, as different processors within one of access nodes 17 can safely access different windows within the stream.

As described herein, data processing units of access nodes 17 may process stream information by managing "work units." In general, a work unit (WU) is a container that is associated with a stream state and used to describe (i.e. point to) data within a stream (stored in memory) along with any associated meta-data and operations to be performed on the data. In the example of FIG. 1, streams of data units may dynamically originate within a peripheral unit of one of access nodes 17 (e.g. injected by a networking unit, a host unit, or a solid state drive interface), or within a processor of the one of access nodes 17, in association with one or more streams of data, and terminate at another peripheral unit or another processor of the one of access nodes 17. Each work unit maintained by a data processing unit is associated with an amount of work that is relevant to the entity executing the work unit for processing a respective portion of a stream.

Stream processing is typically initiated as a result of receiving one or more data units associated with respective portions of the stream and constructing and managing work units for processing respective portions of the data stream. In protocol processing, a portion would be a single buffer (e.g. packet), for example. Within access nodes 17, work units may be executed by processor cores, hardware blocks, I/O interfaces, or other computational processing units. For instance, a processor core of an access node 17 executes a work unit by accessing the respective portion of the stream from memory and performing one or more computations in accordance with the work unit. A component of the one of access nodes 17 may receive, execute or generate work units. A succession of work units may define how the access node processes a flow, and smaller flows may be stitched together to form larger flows.

For purposes of example, DPUs within each access node 17 may execute an operating system, such as a general-purpose operating system (e.g., Linux or other flavor of Unix) or a special-purpose operating system, that provides an execution environment for data plane software for data processing. Moreover, each DPU may be configured to utilize a work unit (WU) stack data structure (referred to as a 'WU stack' in a multiple core processor system. As described herein, the WU stack data structure may provide certain technical benefits, such as helping manage an event driven, run-to-completion programming model of an operating system executed by the multiple core processor system. The WU stack, in a basic form, may be viewed as a stack of continuation WUs used in addition to (not instead of) a program stack maintained by the operating system as an efficient means of enabling program execution to dynamically move between cores of the access node while performing high-rate stream processing. As described below, a WU data structure is a building block in the WU stack and can readily be used to compose a processing pipeline and services execution in a multiple core processor system. The WU stack structure carries state, memory, and other information in auxiliary variables external to the program stack for any given processor core. In some implementations, the WU stack may also provide an exception model for handling abnormal events and a 'success bypass' to shortcut a long series of operations. Further, the WU stack may be used as an arbitrary flow execution model for any combination of pipelined or parallel processing.

As described herein, access nodes 17 may process WUs through a plurality of processor cores arranged as processing pipelines within access nodes 17, and such processing cores may employ techniques to encourage efficient processing of such work units and high utilization of processing resources. For instance, a processing core (or a processing unit within a core) may, in connection with processing a series of work units, access data and cache the data into a plurality of segments of a level 1 cache associated with the processing core. In some examples, a processing core may process a work unit and cache data from non-coherent memory in a segment of the level 1 cache. The processing core may also concurrently prefetch data associated with a work unit expected to be processed in the future into another segment of the level 1 cache associated with the processing core. By prefetching the data associated with the future work unit in advance of the work unit being dequeued from a work unit queue for execution by the core, the processing core may be able to efficiently and quickly process a work unit once the work unit is dequeued and execution of the work unit is to commence by the processing core. More details on work units and stream processing by data processing units of access nodes are available in U.S. Provisional Patent Application No. 62/589,427, filed Nov. 21, 2017, entitled "Work Unit Stack Data Structures in Multiple Core Processor System," and U.S. Provisional Patent Application No. 62/625,518, entitled "EFFICIENT WORK UNIT PROCESSING IN A MULTICORE SYSTEM", filed Feb. 2, 2018, the entire contents of both being incorporated herein by reference.

As described herein, the data processing units for access nodes 17 includes one or more specialized hardware-based accelerators configured to perform acceleration for various data-processing functions, thereby offloading tasks from the processing units when processing work units. That is, each accelerator is programmable by the processing cores, and one or more accelerators may be logically chained together to operate on stream data units, such as by providing cryptographic functions, compression and regular expression (RegEx) processing, data durability functions, data storage functions and networking operations.

In FIG. 1, and in accordance with one or more aspects of the present disclosure, one or more of access nodes 17 may store data across data center 10. For instance, in the example of FIG. 1, access node 17-1 of NCSU 40-1 receives data from one or more servers 12 (e.g., one of servers 12-1 through 12-N). Access node 17-1 processes the data by applying a data durability encoding algorithm. In some examples, the data durability encoding algorithm is a Reed Solomon erasure coding algorithm that results in the data being split into multiple data fragments. In addition, the multiple data fragments are used to generate one or more parity data fragments. Performing an erasure coding operation may, in some examples, require significant computing resources. If access node 17-1 performs the erasure coding operation, however, each of servers 12 may be able to perform other productive operations.

Access node 17-1 stores each of the data fragments (both the data fragments resulting from the split and also the parity data fragments) across data center 10. In the example of FIG. 1, access node 17-1 stores each of the data fragments within a different fault domain, where each fault domain corresponds to each of NCSUs 40. In other words, each data fragment generated by access node 17-1 is stored within a different NCSU 40 across data center 10. If the failure of one NCSU 40 is unlikely to be correlated with the failure of another NCSU 40, storing data fragments in different NCSUs 40 may reduce the likelihood that more than one data fragment will be lost or unavailable due to a hardware or software error (or other cause of unavailability).

After storing the data fragments, access node 17-1 may receive a request (e.g., a "read" request) for a portion of or all of the stored data that has stored across data center 10 as data fragments. For instance, in the example of FIG. 1, access node 17-1 may receive a request, from one of servers 12, to read the same data that access node 17 stored as data fragments across data center 10, as described above. After receiving the request, access node 17-1 accesses a directory, stored within access node 17-1 or elsewhere, identifying where each of the data fragments are stored within data center 10. Access node 17 determines whether each of the data fragments are available at the location specified in the directory. If the data fragments are available, access node 17-1 retrieves the data fragments from each specified location (i.e., each failure domain) and reassembles them into the original data.

If one or more of the data fragments are not available, however, access node 17-1 accesses one or more of the parity data fragments and uses the parity data fragments, along with the available data fragments, to reconstruct the original data. To do so, access node 17-1 performs a data durability decoding operation to reconstruct the data. If the data was encoded using a Reed Solomon erasure coding algorithm, for example, the decoding operation involves a corresponding Reed Solomon decoding operation. As with the encoding operation, the decoding operation may be a computationally intensive operation. However, if access node 17-1 performs some or all of the processing associated with the decoding operation, servers 12 may again continue other productive operations, and at least some of the latency and/or expenditure of server computational resources that might otherwise be associated with the erasure coding operations is avoided. When the decode operation is complete, the reconstructed data is output to the requesting server 12 as a response to the read request.

Through techniques in accordance with one or more aspects of the present disclosure, such as by storing data in fragments across multiple failure domains in a manner that enables efficient recovery of the data using only a subset of the data, data center 10 may perform inline recovery of actively used data. By performing inline recovery of actively-used or hot data, data center 10 may operate reliably and efficiently because data will be available and quickly accessible, even in situations where a hardware or software error (or other event causing aspects of a network to be impacted) occurs. Therefore, aspects of this disclosure may improve the function of data center 10 because data durability coding on a network, in a manner consistent with techniques described herein, may have the effect of causing data center 10 to be more reliable and efficient.

Further, by storing data across multiple fault domains in a manner that enables efficient recovery of the data using only a subset of the data, it may be possible to use data durability techniques that require less storage, since multiple independent fault domains are less likely to fail at the same time. By using data durability techniques that require less storage, data center 10 may effectively be able to store more data, since the data durability techniques would not require as much redundant storage of data, thereby effectively increasing the space that can be used for non-redundant storage of data. Therefore, aspects of this disclosure may improve the function of data center 10 because data durability coding on a network, in a manner consistent with the techniques described herein, may have the effect of increasing effective storage capacity of data center 10.

In some examples, some or all of access nodes 17 may be configured to perform data durability operations in a flexible manner, implementing a range of data durability methods and functions from simple to complex. Such schemes may range from data replication schemes, simple parity encoding schemes, RAID encoding schemes, erasure coding schemes (e.g., Reed Solomon encoding schemes), and hierarchical erasure coding schemes. To implement some or all of such schemes, each of access nodes 17 may be configured to implement a common and/or unified matrix approach that implements different data durability schemes based on a matrix of coefficients chosen or configured for each scheme. By choosing or selecting a different matrix of coefficients, each of access nodes 17 may perform or implement a different approach to data durability.

Through techniques in accordance with one or more aspects of the present disclosure, such as by implementing each of a variety of durability coding and/or erasure coding schemes using a common matrix approach, one or more of access nodes 17 may provide an abstraction layer for data durability that enables flexible configuration and software programmability. In such an implementation, each of access nodes 17 may operate more reliably and efficiently, since software developed for access nodes 17 may be based on the abstraction layer, thereby reducing the complexity required to develop and test software for implementing data durability functions. Therefore, aspects of this disclosure may improve the function of access node 17 because implementing durability coding and/or erasure coding schemes using a common matrix approach may have the effect of causing software developed for access node 17 to be of higher quality, thereby enabling access node 17 to operate more reliably and efficiently.

Figure 2:
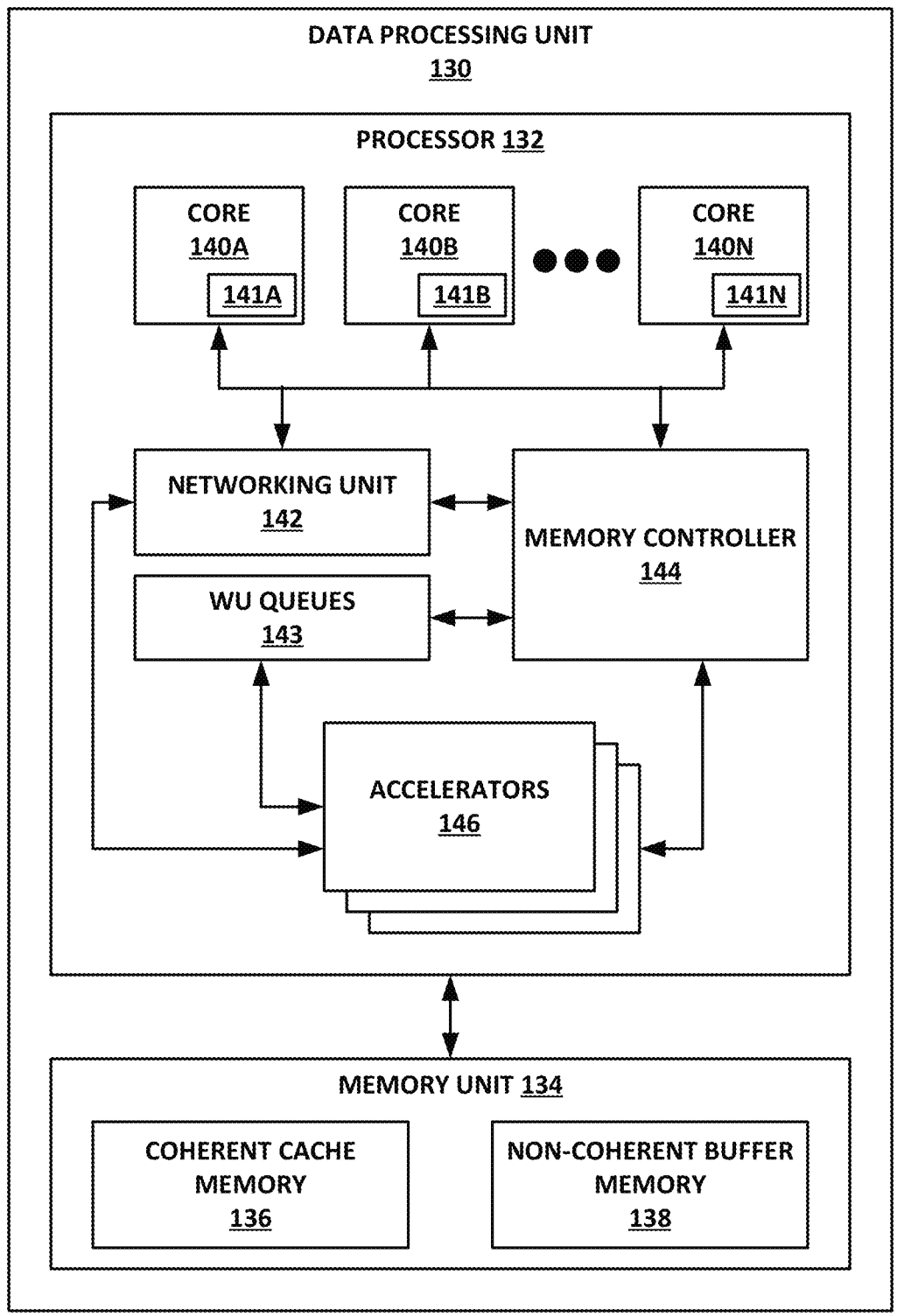
FIG. 2 is a block diagram illustrating an example data processing unit (DPU) including two or more processing cores, in accordance with the techniques of this disclosure.

FIG. 2 is a block diagram illustrating an example data processing unit (DPU) 130 including two or more processing cores, in accordance with the techniques of this disclosure. DPU 130 generally represents a hardware chip implemented in digital logic circuitry and may be used in any computing or network device. DPU 130 may operate substantially similar to and generally represent any of access nodes 17 of FIG. 1. Thus, DPU 130 may be communicatively coupled to one or more network devices, server devices (e.g., servers 12), random access memory, storage media (e.g., solid state drives (SSDs)), a data center fabric (e.g., switch fabric 14), or the like, e.g., via PCI-e, Ethernet (wired or wireless), or other such communication media. Moreover, DPU 130 may be implemented as one or more application-specific integrated circuit (ASIC), may be configurable to operate as a component of a network appliance or may be integrated with other DPUs within a device.

In the illustrated example of FIG. 2, DPU 130 includes a multi-core processor 132 having a plurality of programmable processing cores 140A-140N ("cores 140") coupled to an on-chip memory unit 134. Each of cores 140 includes a level 1 cache 141 (level 1 caches 141A, 141B, and 141N are associated with cores 140A, 140B, and 140N, respectively).

Memory unit 134 may include two types of memory or memory devices, namely coherent cache memory 136 and non-coherent buffer memory 138. Processor 132 also includes a networking unit 142, work unit (WU) queues 143, a memory controller 144, and accelerators 146. As illustrated in FIG. 2, each of cores 140, networking unit 142, WU queues 143, memory controller 144, memory unit 134, and accelerators 146 are communicatively coupled to each other. In some examples, processor 132 of DPU 130 further includes one or more accelerators (not shown) configured to perform acceleration for various data-processing functions, such as look-ups, matrix multiplication, cryptography, compression, regular expressions, or the like.

In this example, DPU 130 represents a high performance, hyper-converged network, storage, and data processor and input/output hub. For example, networking unit 142 may be configured to receive one or more data packets from and transmit one or more data packets to one or more external devices, e.g., network devices. Networking unit 142 may perform network interface card functionality, packet switching, and the like, and may use large forwarding tables and offer programmability. Networking unit 142 may expose Ethernet ports for connectivity to a network, such as switch fabric 14 of FIG. 1. DPU 130 may also include one or more interfaces for connectivity to host devices (e.g., servers) and data storage devices, e.g., solid state drives (SSDs) via PCIe lanes. DPU 130 may further include one or more high bandwidth interfaces for connectivity to off-chip external memory.

Processor 132 further includes accelerators 146 configured to perform acceleration for various data-processing functions, such as look-ups, matrix multiplication, cryptography, compression, data durability and/or reliability, regular expressions, or the like. For example, accelerators 146 may comprise hardware implementations of look-up engines, matrix multipliers, cryptographic engines, compression engines, or the like. In accordance with the techniques of this disclosure, at least one of accelerators 146 represents a data durability unit that may be used to implement one or more data durability and/or reliability schemes. In some examples, such a data durability unit may be configured to perform matrix multiplication operations commonly performed in erasure coding schemes, such as Reed Solomon erasure coding schemes. Such a data durability unit may be configured to efficiently perform operations, such as those relating to Galois Field mathematics, that might be difficult and/or inefficient to perform using commonly available processors or other processing hardware. Further, such a data durability unit may be designed to perform and/or implement multiple different types of data durability schemes by configuring different matrices specific to each implementation. In such an example, implementing a different data durability scheme may involve choosing or generating a different coefficient matrix for use in encoding and/or decoding data, as further discussed below.

Memory controller 144 may control access to on-chip memory unit 134 by cores 140, networking unit 142, and any number of external devices, e.g., network devices, servers, external storage devices, or the like. Memory controller 144 may be configured to perform a number of operations to perform memory management in accordance with the present disclosure. For example, memory controller 144 may be capable of mapping accesses from one of the cores 140 to either of coherent cache memory 136 or non-coherent buffer memory 138. More details on the bifurcated memory system included in the DPU are available in U.S. Provisional Patent Application No. 62/483,844, filed Apr. 10, 2017, and titled "Relay Consistent Memory Management in a Multiple Processor System," the entire content of which is incorporated herein by reference.

Cores 140 may comprise one or more microprocessors without interlocked pipeline stages (MIPS) cores, advanced reduced instruction set computing (RISC) machine (ARM) cores, performance optimization with enhanced RISC-performance computing (PowerPC) cores, RISC Five (RISC-V) cores, or complex instruction set computing (CISC or x86) cores. Each of cores 140 may be programmed to process one or more events or activities related to a given data packet such as, for example, a networking packet or a storage packet. Each of cores 140 may be programmable using a high-level programming language, e.g., C, C++, or the like.

Each of level 1 caches 141 may include a plurality of cache lines logically or physically divided into cache segments. Each of level 1 caches 141 may be controlled by a load/store unit also included within the core. The load/store unit may include logic for loading data into cache segments and/or cache lines from non-coherent buffer memory 138 and/or memory external to DPU 130. The load/store unit may also include logic for flushing cache segments and/or cache lines to non-coherent buffer memory 138 and/or memory external to DPU 130. In some examples, the load/store unit may be configured to prefetch data from main memory during or after a cache segment or cache line is flushed.

As described herein, processor cores 140 may be arranged as processing pipelines, and such processing cores may employ techniques to encourage efficient processing of such work units and high utilization of processing resources. For instance, any of processing cores 140 (or a processing unit within a core) may, in connection with processing a series of work units retrieved from WU queues 143, access data and cache the data into a plurality of segments of level 1 cache 141 associated with the processing core. In some examples, a processing core 140 may process a work unit and cache data from non-coherent memory 138 in a segment of the level 1 cache 141. As described herein, concurrent with execution of work units by cores 140, a load store unit of memory controller 144 may be configured to prefetch, from non-coherent memory 138, data associated with work units within WU queues 143 that are expected to be processed in the future, e.g., the WUs now at the top of the WU queues and next in line to be processed. For each core 140, the load store unit of memory controller 144 may store the prefetched data associated with the WU to be processed by the core into a standby segment of the level 1 cache 141 associated with the processing core 140.

In some examples, the plurality of cores 140 executes instructions for processing a plurality of events related to each data packet of one or more data packets, received by networking unit 142, in a sequential manner in accordance with one or more work units associated with the data packets. As described above, work units are sets of data exchanged between cores 140 and networking unit 142 where each work unit may represent one or more of the events related to a given data packet.

As one example use case, stream processing may be divided into work units executed at a number of intermediate processors between source and destination. Depending on the amount of work to be performed at each stage, the number and type of intermediate processors that are involved may vary. In processing a plurality of events related to each data packet, a first one of the plurality of cores 140, e.g., core 140A may process a first event of the plurality of events. Moreover, first core 140A may provide to a second one of plurality of cores 140, e.g., core 140B a first work unit of the one or more work units. Furthermore, second core 140B may process a second event of the plurality of events in response to receiving the first work unit from first core 140B.

As another example use case, transfer of ownership of a memory buffer between processing cores may be mediated by a work unit message delivered to one or more of processing cores 140. For example, the work unit message may be a four-word message including a pointer to a memory buffer. The first word may be a header containing information necessary for message delivery and information used for work unit execution, such as a pointer to a function for execution by a specified one of processing cores 140. Other words in the work unit message may contain parameters to be passed to the function call, such as pointers to data in memory, parameter values, or other information used in executing the work unit.

In one example, receiving a work unit is signaled by receiving a message in a work unit receive queue (e.g., one of WU queues 143). The one of WU queues 143 is associated with a processing element, such as one of cores 140, and is addressable in the header of the work unit message. One of cores 140 may generate a work unit message by executing stored instructions to addresses mapped to a work unit transmit queue (e.g., another one of WU queues 143). The stored instructions write the contents of the message to the queue. The release of a work unit message may be interlocked with (gated by) flushing of the core's dirty cache data and in some examples, prefetching into the cache of data associated with another work unit for future processing.

Figure 3:
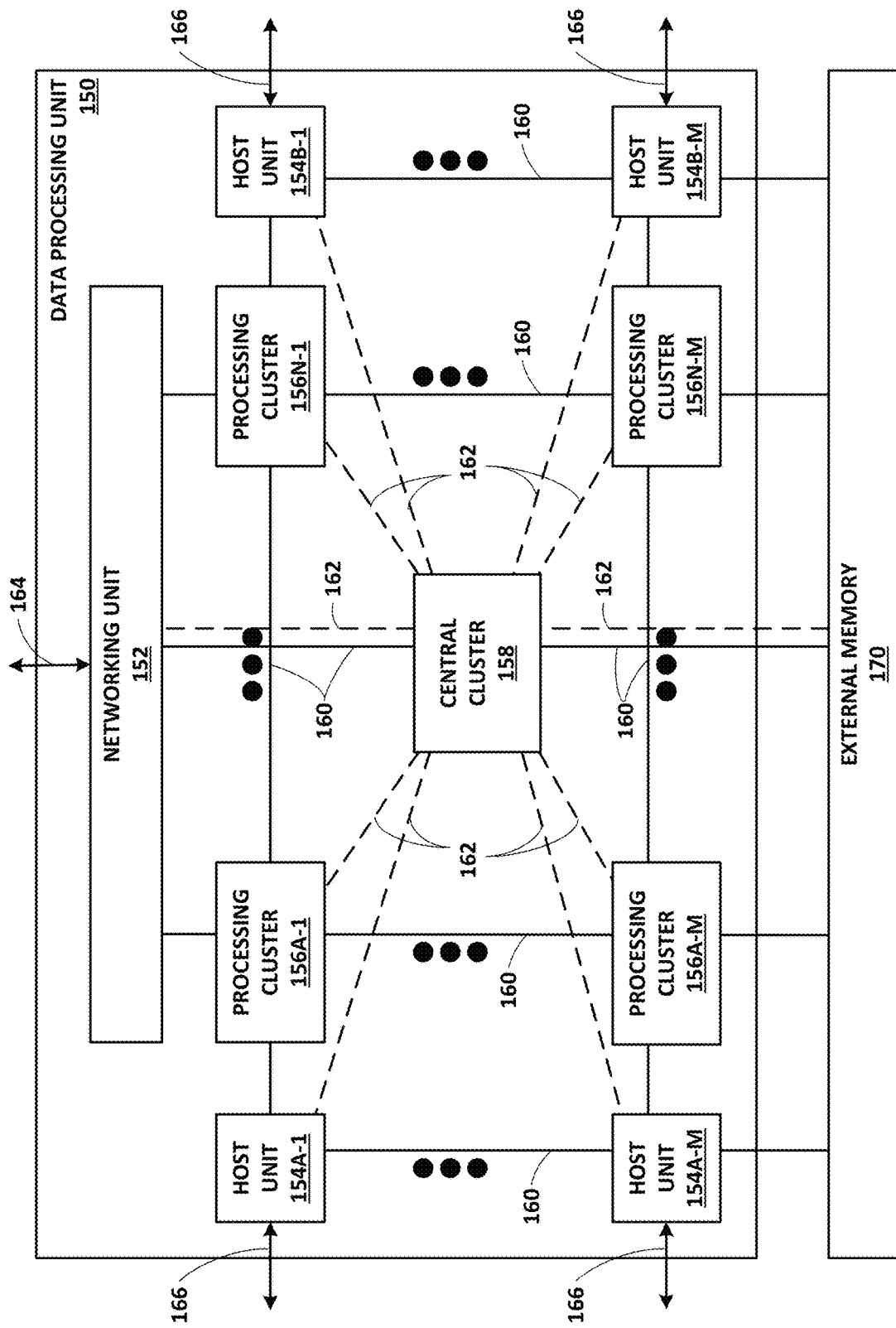
FIG. 3 is a block diagram illustrating another example of a DPU including two or more processing clusters, in accordance with the techniques of this disclosure.

FIG. 3 is a block diagram illustrating another example of a DPU 150 including two or more processing clusters, in accordance with the techniques of this disclosure. DPU 150 may operate substantially similar to any of the access nodes 17 of FIG. 1. Thus, DPU 150 may be communicatively coupled to a data center fabric (e.g., switch fabric 14), one or more server devices (e.g., servers 12), storage media (e.g., SSDs), one or more network devices, random access memory, or the like, e.g., via PCI-e, Ethernet (wired or wireless), or other such communication media in order to interconnect each of these various elements. DPU 150 generally represents a hardware chip implemented in digital logic circuitry. As various examples, DPU 150 may be provided as an integrated circuit mounted on a motherboard of a computing, networking and/or storage device or installed on a card connected to the motherboard of the device.

In general, DPU 150 represents a high performance, hyper-converged network, storage, and data processor and input/output hub. As illustrated in FIG. 3, DPU 150 includes networking unit 152, processing clusters 156A-1 to 156N-M (processing clusters 156), host units 154A-1 to 154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM) or dynamic random access memory (DRAM).

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of DPU 150, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSD devices. This allows DPU 150 to operate as an endpoint or as a root. For example, DPU 150 may connect to a host system (e.g., a server) as an endpoint device, and DPU 150 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

DPU 150 provides optimizations for stream processing. DPU 150 executes an operating system that facilitates run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In one example, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

DPU 150 operates on work units (WUs) that associate a buffer with an instruction stream to reduce dispatching overhead and allow processing by reference to minimize data movement and copy. The stream-processing model may structure access by multiple processors (e.g., processing clusters 156) to the same data and resources, avoid simultaneous sharing, and therefore, reduce contention. A processor may relinquish control of data referenced by a work unit as the work unit is passed to the next processor in line. Central cluster 158 may include a central dispatch unit responsible for work unit queuing and flow control, work unit and completion notification dispatch, and load balancing and processor selection from among processing cores of processing clusters 156 and/or central cluster 158.

As described above, work units are sets of data exchanged between processing clusters 156, networking unit 152, host units 154, central cluster 158, and external memory 170. Each work unit may be represented by a fixed length data structure, or message, including an action value and one or more arguments. In one example, a work unit message includes four words, a first word having a value representing an action value and three additional words each representing an argument. The action value may be considered a work unit message header containing information necessary for message delivery and information used for work unit execution, such as a work unit handler identifier, and source and destination identifiers of the work unit. The other arguments of the work unit data structure may include a frame argument having a value acting as a pointer to a continuation work unit to invoke a subsequent work unit handler, a flow argument having a value acting as a pointer to state that is relevant to the work unit handler, and a packet argument having a value acting as a packet pointer for packet and/or block processing handlers.

In some examples, one or more processing cores of processing clusters 180 may be configured to execute program instructions using a work unit (WU) stack. In general, a work unit (WU) stack is a data structure to help manage event driven, run-to-completion programming model of an operating system typically executed by processing clusters 156 of DPU 150, as further described in U.S. Patent Application Ser. No. 62/589,427, filed Nov. 21, 2017, the entire content of which is incorporated herein by reference.

As described herein, in some example implementations, load store units within processing clusters 156 may, concurrent with execution of work units by cores within the processing clusters, identify work units that are enqueued in WU queues for future processing by the cores. In some examples, WU queues storing work units enqueued for processing by the cores within processing clusters 156 may be maintained as hardware queues centrally managed by central cluster 158. In such examples, load store units may interact with central cluster 158 to identify future work units to be executed by the cores within the processing clusters. The load store units prefetch, from the non-coherent memory portion of external memory 170, data associated with the future work units. For each core within processing clusters 156, the load store units of the core may store the prefetched data associated with the WU to be processed by the core into a standby segment of the level 1 cache associated with the processing core.

Figure 4:
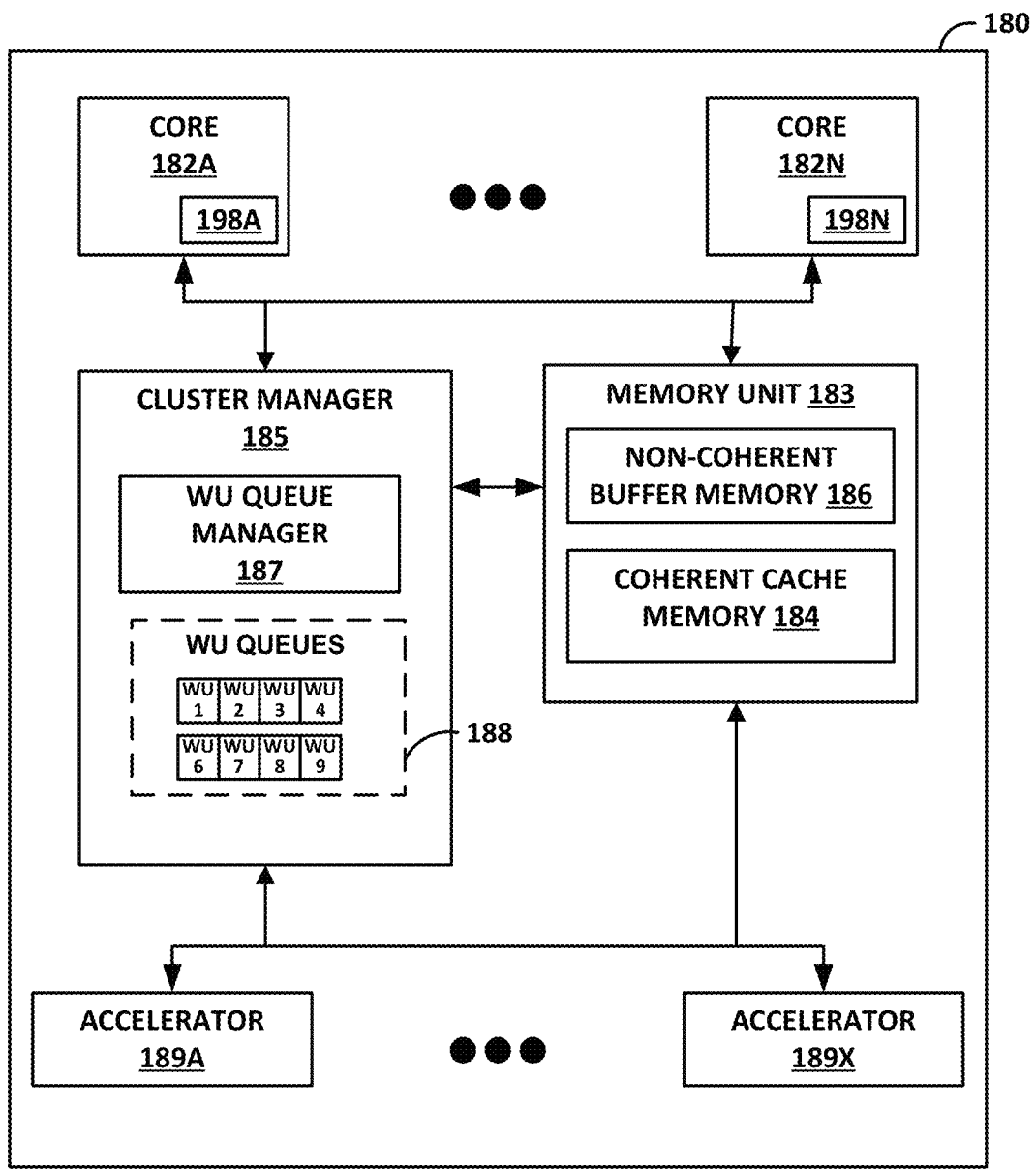
FIG. 4 is a block diagram illustrating an example processing cluster including two or more processing cores, in accordance with the techniques of this disclosure.

FIG. 4 is a block diagram illustrating an example processing cluster 180 including two or more processing cores 182A-182N. Each of processing clusters 156 of DPU 150 of FIG. 3 may be configured in a manner substantially similar to processing cluster 180 shown in FIG. 4. In the example of FIG. 4, processing cluster 180 includes cores 182A-182N ("cores 182"), a memory unit 183 including a coherent cache memory 184 and a non-coherent buffer memory 186, a cluster manager 185 including WU queue manager 187 for maintaining (e.g., within hardware registers of processing cluster 180) and manipulating WU queues 188, and accelerators 189A-189X ("accelerators 189"). Each of cores 182 includes L1 buffer cache 198 (i.e., core 182 includes L1 buffer cache 198A and in general, core 182N includes L1 buffer cache 198N). In some examples, cluster manager 185 is alternatively located within central cluster 158, and/or WU queues 188 are alternatively maintained within central cluster 158 (e.g., within hardware registers of central cluster 158).

An access node or DPU (such as access nodes 17 of FIG. 1, DPU 130 of FIG. 2, or DPU 150 of FIG. 3) may support two distinct memory systems: a coherent memory system and a non-coherent buffer memory system. In the example of FIG. 4, coherent cache memory 184 represents part of the coherent memory system while non-coherent buffer memory 186 represents part of the non-coherent buffer memory system. Cores 182 may represent the processing cores discussed with respect to DPU 150 of FIG. 3. Cores 182 may share non-coherent buffer memory 186. As one example, cores 182 may use non-coherent buffer memory 186 for sharing streaming data, such as network packets.

In general, accelerators 189 perform acceleration for various data-processing functions, such as table lookups, matrix multiplication, cryptography, compression, data durability, regular expressions, or the like. That is, accelerators 189 may comprise hardware implementations of lookup engines, matrix multipliers, cryptographic engines, compression engines, data durability encoders and/or decoders, regular expression interpreters, or the like. For example, accelerators 189 may include a matrix multiplication engine, or a lookup engine that performs hash table lookups in hardware to provide a high lookup rate. A lookup engine, for example, may be invoked through work units from external interfaces and virtual processors of cores 182, and generates lookup notifications through work units. Accelerators 189 may also include one or more cryptographic units to support various cryptographic processes. Accelerators 189 may also include one or more compression units to perform compression and/or decompression. Accelerators 189 may further include one or more data durability units to perform functions relating to data durability, erasure coding, and/or data reliability.

An example process by which a processing cluster 180 processes a work unit is described here. Initially, cluster manager 185 of processing cluster 180 may queue a work unit (WU) in a hardware queue of WU queues 188. When cluster manager 185 "pops" the work unit from the hardware queue of WU queues 188, cluster manager 185 delivers the work unit to one of accelerators 189, e.g., a lookup engine. The accelerator 189 to which the work unit is delivered processes the work unit and determines that the work unit is to be delivered to one of cores 182 (in particular, core 182A, in this example) of processing cluster 180. Thus, the one of accelerators 189 forwards the work unit to a local switch of the signaling network on the DPU, which forwards the work unit to be queued in a virtual processor queue of WU queues 188.

As noted above, in accordance with the techniques of this disclosure, one or more of accelerators 189 may be configured to data durability functions and/or erasure coding functions. A data durability accelerator of accelerators 189, in accordance with the techniques of this disclosure, may include processing circuitry capable of efficiently performing erasure coding operations, which may, in some examples, involve matrix multiplication and/or Galois Field mathematical operations. Such a data durability accelerator may enable storage of data fragments, including parity data fragments, across different fault domains within data center 10. Further, such a data durability accelerator may enable retrieval and reconstruction of data where only a subset of the original data fragments are available within data center 10.

After cluster manager 185 pops the work unit from the virtual processor queue of WU queues 188, cluster manager 185 delivers the work unit via a core interface to core 182A, in this example. An interface unit of core 182A then delivers the work unit to one of the virtual processors of core 182A.

Core 182A processes the work unit, which may involve accessing data, such as a network packet or storage packet, in non-coherent memory 156A and/or external memory 170. Core 182A may first look for the corresponding data in cache 198A, and in the event of a cache miss, may access the data from non-coherent memory 156A and/or external memory 170. In some examples, while processing the work unit, core 182A may store information (i.e., the network packet or data packet) associated with the work unit in an active segment of cache 198A. Further, core 182A may, while processing the work unit, prefetch data associated with a second work unit into a different, standby segment of cache 198A. When core 182A completes processing of the work unit, core 182A initiates (or causes initiation of) a cache flush for the active segment, and may also initiate prefetching of data associated with a third work unit (to be processed later) into that active segment. Core 182A (or a virtual processor within core 182A) may then swap the active segment and the standby segment so that the previous standby segment becomes the active segment for processing of the next work unit (i.e., the second work unit). Because data associated with the second work unit was prefetched into this now active segment, core 182A (or a virtual processor within core 182A) may be able to more efficiently process the second work unit. Core 182A then outputs corresponding results (possibly including one or more work unit messages) from performance of the work unit back through the interface unit of core 182A.

As described herein, in some example implementations, load store units within memory unit 183 may, concurrent with execution of work units by cores 182 within the processing cluster 180, identify work units that are enqueued in WU queues 188 for future processing by the cores. The load store units prefetch, from a non-coherent memory portion of external memory 170, data associated with the future work units and store the prefetched data associated with the WUs to be processed by the cores into a standby segment of the level 1 cache associated with the particular processing cores.

Figure 5:
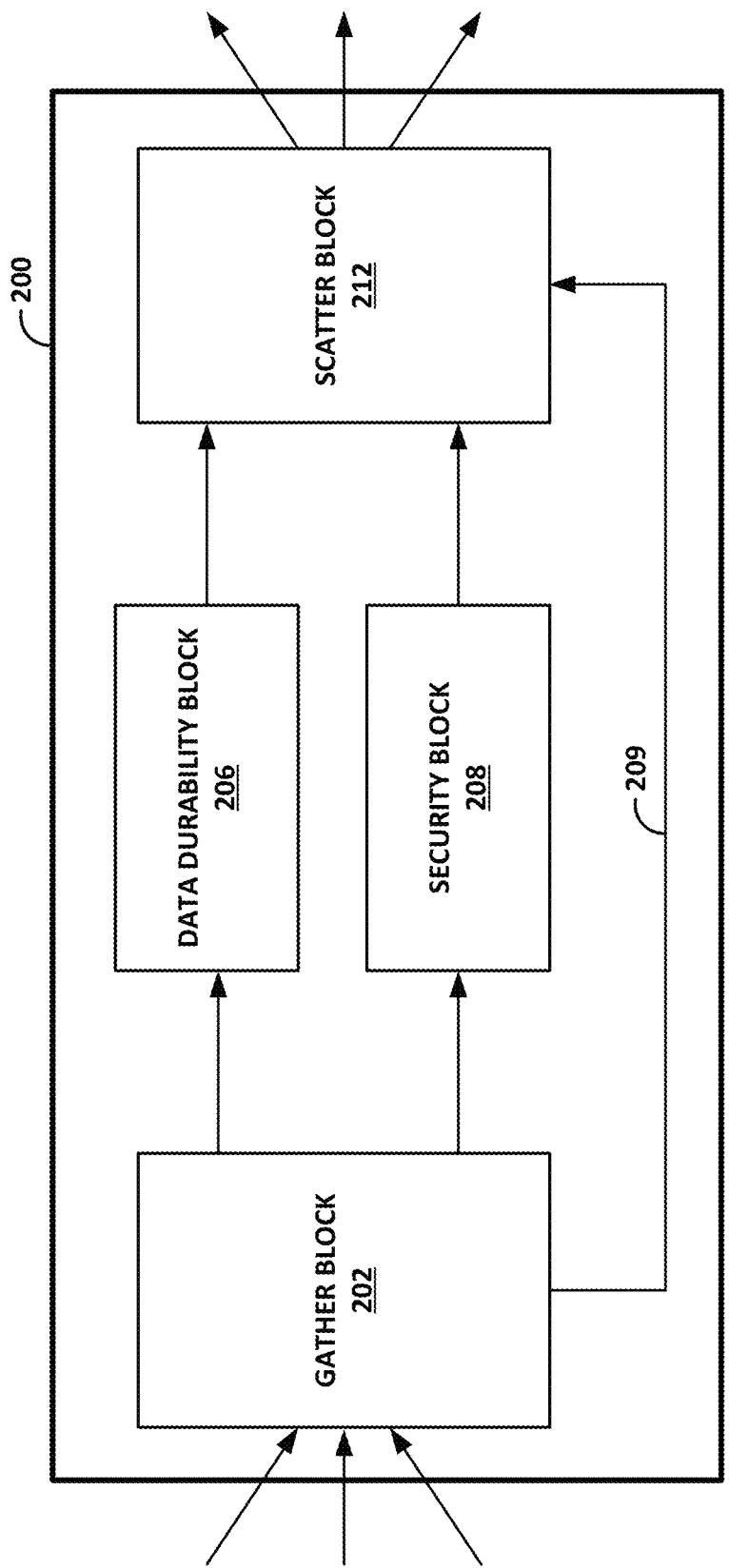
FIG. 5 is a block diagram illustrating an example accelerator, in accordance with one or more aspects of the present disclosure.

FIG. 5 is a block diagram illustrating an example accelerator, in accordance with one or more aspects of the present disclosure. In the example of FIG. 5, accelerator 200 may be one of accelerators 146 of data processing unit 130 from FIG. 2, or one of accelerators 189 of processing cluster 180 from FIG. 4. In some examples, accelerator 200 may be included in some or all of processing clusters 156 of data processing unit 150 illustrated in FIG. 3.

In the example of FIG. 5, accelerator 200 is configured to accelerate, improve, and/or modify operations relating to data durability and/or reliability that might otherwise be performed by software executing on a general purpose processor. As illustrated in FIG. 5, accelerator 200 may include one or more gather blocks 202, one or more data durability blocks 206, one or more security blocks 208, and one or more scatter blocks 212. Further, in some examples, other types of specific-function blocks, beyond data durability block 206 and security block 208, may also be included within accelerator 200. In addition, as illustrated in FIG. 5, pass-through connection 209 may also be included within accelerator 200. Data durability block 206 and security block 208 may each be implemented as a DMA inline accelerator positioned between gather block 202 and scatter block 212. For data durability block 206, gather block 202 may read a coefficient matrix and data fragments through gather commands, and scatter block 212 may write data fragments and/or parity fragments back to system memory through scatter software commands. Accordingly, gather block 202 may provide data accessed from an external memory, and may serve as an ingress DMA device. Scatter block 212 may send data back to external memory, and may serve as an egress DMA device.

Through these components and/or others described herein, accelerator 200 may support multiple different data durability or erasure coding schemes (e.g., through data durability block 206), enabling data to be reliably stored and retrieved from locations within data center 10. Accelerator 200 may also support security functions (e.g., through security block 208), enabling data received from gather block 202 to be encrypted and/or decrypted before being provided to scatter block 212.

In FIG. 5, and in accordance with one or more aspects of the present disclosure, accelerator 200 may, pursuant to an erasure coding algorithm, encode data stored within processing cluster 180. For instance, in the example of FIG. 5 and with reference to FIG. 4, gather block 202 receives and gathers multiple streams of data from memory unit 183 within processing cluster 180. Gather block 202 outputs the gathered streams to data durability block 206. Data durability block 206 performs an erasure code encoding operation, splitting data into data fragments and generating one or more parity fragments. Data durability block 206 outputs the data fragments to scatter block 212. Scatter block 212 scatters the fragments across memory unit 183 within processing cluster 180. In some examples, data durability block 206 may perform erasure coding operations based on portions of data fragments pursuant to a strided read operation as further described herein (e.g., see FIG. 8C).

Figure 6A:
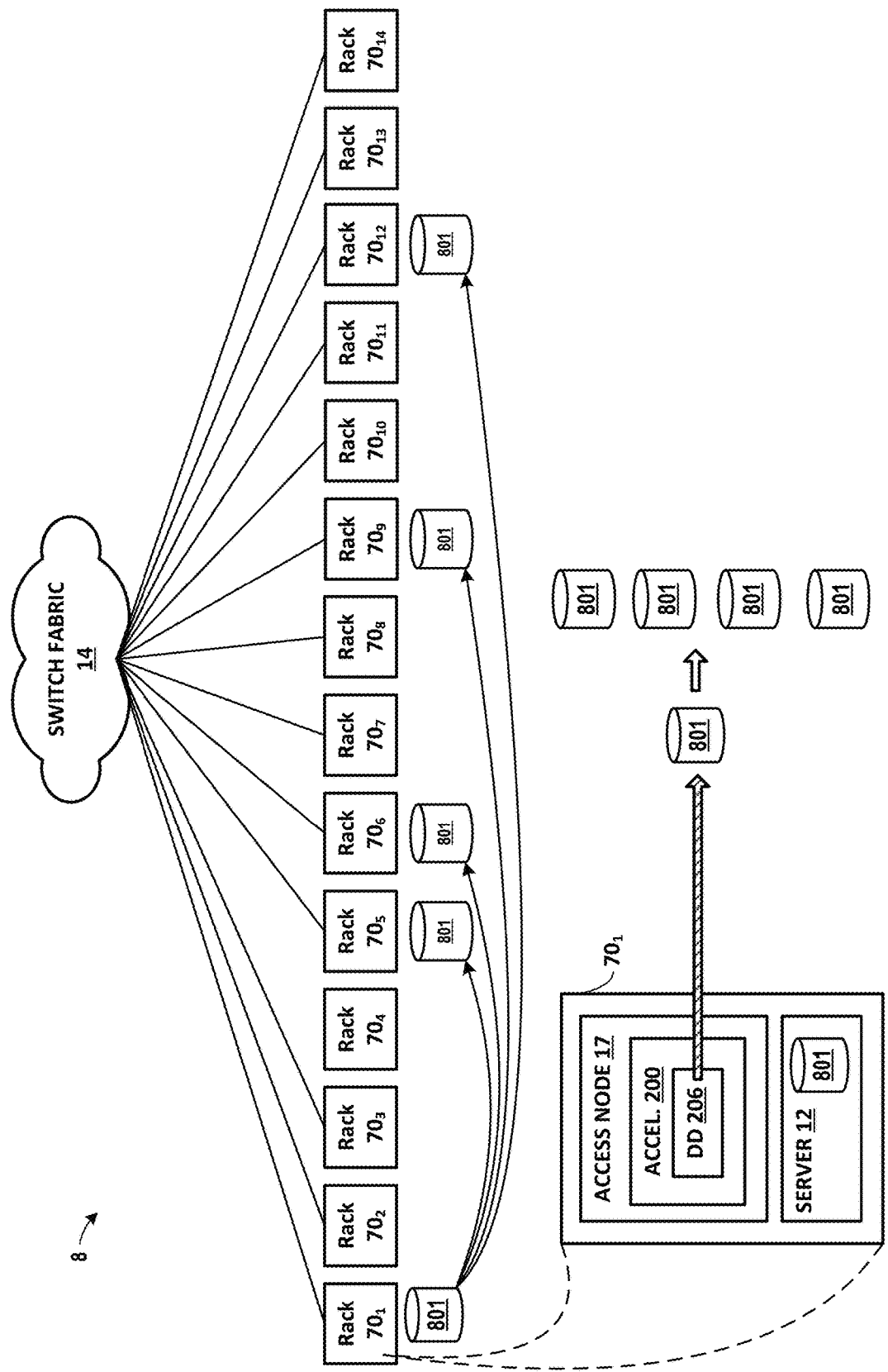
FIG. 6A is a conceptual diagram illustrating an example write operation performed pursuant to a basic replication data reliability scheme, in accordance with one or more aspects of the present disclosure.

FIG. 6A is a conceptual diagram illustrating an example write operation performed pursuant to a basic replication data reliability scheme, in accordance with one or more aspects of the present disclosure. FIG. 6A illustrates a number of racks 70, each connected through switch fabric 14. In the example of FIG. 6A, each of racks 70 may be considered a separate failure domain. Each of racks 70 include one or more access nodes 17 and one or more servers 12. For example, in FIG. 6A, rack 70-1 includes access node 17 and server 12, which may correspond to one of access nodes 17 within one of servers 12 of FIG. 1. Further, in some examples, each of access nodes 17 may correspond to data processing unit 130 as illustrated in FIG. 2 or data processing unit 150 as illustrated in FIG. 3.

Also as illustrated in FIG. 6A, access node 17 of rack 70-1 includes one or more accelerators 200. Accelerator 200 includes one or more data durability blocks 206, which may correspond to data durability block 206 as illustrated in FIG. 5.

In the example of FIG. 6A, and in accordance with one or more aspects of the present disclosure, access node 17 may store duplicate copies of data 801 across network 8. For instance, in the example of FIG. 6A, access node 17 receives data 801 from server 12. Access node 17 also receives a command to store data 801. In response to the command, access node 17 outputs data 801 to accelerator 200. Accelerator 200 passes data 801 through data durability block 206, which replicates data 801. In some examples, data durability block 206 replicates data 801 a number of times sufficient to ensure a desired level of reliability for storage of data 801. In some examples, data durability block 206 may replicate data 801 four times as illustrated in the example of FIG. 6A. In other examples, the data may be replicated more times (e.g., six times) or fewer times. After replicating data 801, access node 17 outputs each of the replicated copies over switch fabric 14, and each replicated copy of the data set is stored within a different one of racks 70 across network 8. If one of data sets 801 fails or is unavailable, access node 17 may recover the data by reading from any of the other data sets 801 stored on the network.

In the example of FIG. 6A, each of racks 70 is considered an independent failure domain, so access node 17 may store each of the replicated data sets 801 within a different rack 70. In other examples, however, it may be desirable, necessary, or otherwise appropriate for some of replicated data sets 801 may be stored within the same rack.

As illustrated in FIG. 6A, data durability block 206 within rack 70-1 stores data within network 8 pursuant to a data durability scheme that involves simply replicating data 801, and storing replicas of data 801 within failure domains across network 8. This type of data durability scheme tends to exhibit fast recovery times, little complexity, and little or no computational resource requirements. Further, the example of FIG. 6A has low read costs because to recover from a data unavailability event impacting data 801, access node 17 might simply read from one of the replicated data sets 801 stored across network 8. Further, access node 17 might only have to read from one of the duplicate data sets 801 a single time. However, for the durability scheme illustrated in FIG. 6A, storage costs are high—more than 100% storage overhead—since a significant amount of storage is required to store duplicate copies of data 801.

Figure 6B:
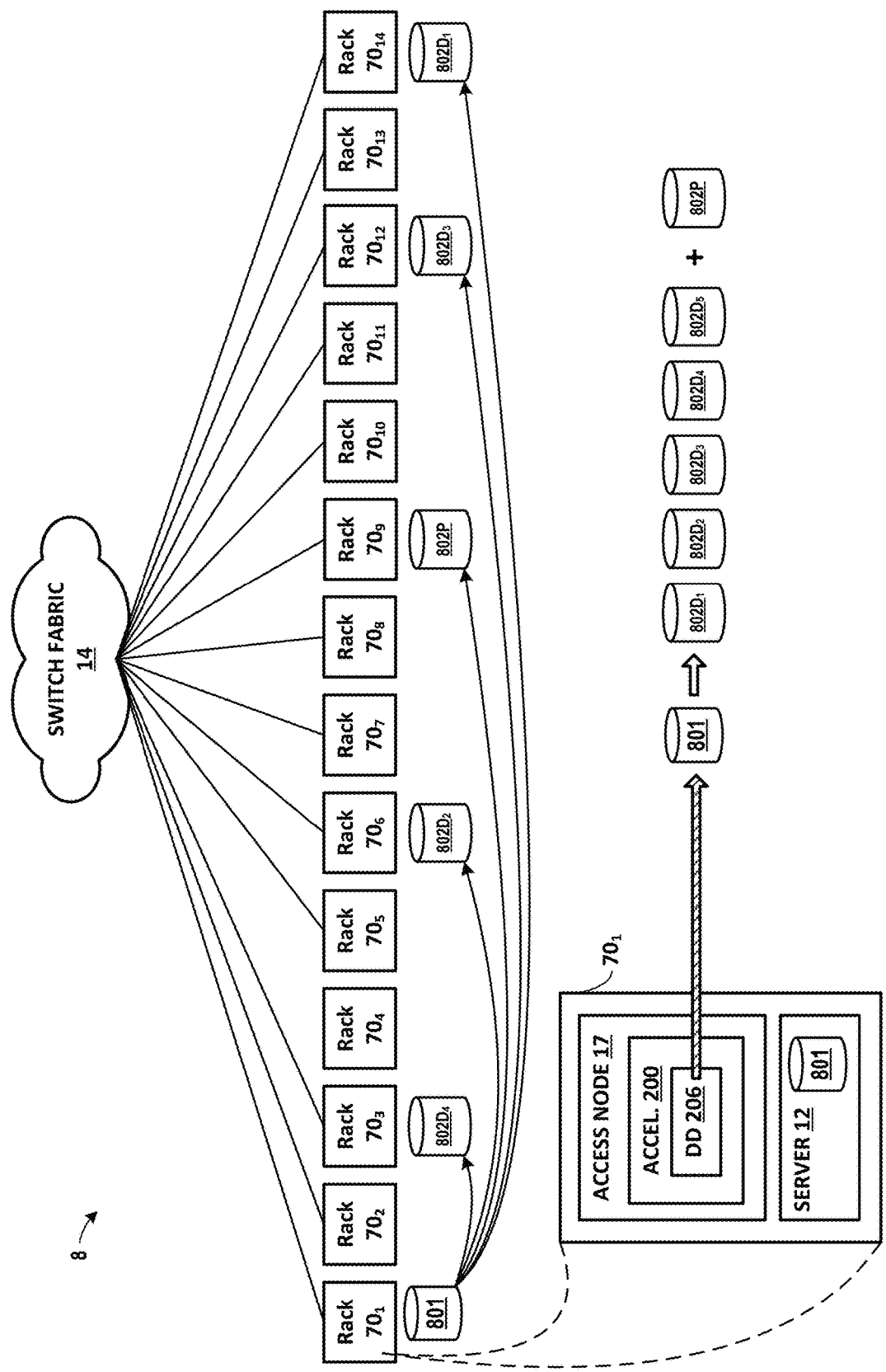
FIG. 6B is a conceptual diagram illustrating an example write operation performed pursuant to a simple parity encoding data reliability scheme, in accordance with one or more aspects of the present disclosure.

FIG. 6B is a conceptual diagram illustrating an example write operation performed pursuant to a simple parity encoding data reliability scheme, in accordance with one or more aspects of the present disclosure. As in FIG. 6A, FIG. 6B includes a number of racks 70, each connected through switch fabric 14. Rack 70-1 includes one or more access nodes 17 and one or more servers 12. Access node 17 includes one or more accelerators 200 and one or more data durability blocks 206. In FIG. 6B, data durability block 206 generates data fragment 802P from data fragments 802D-1, 802D-2, 802D-3, 802D-4, and 802D-5 (collectively "data fragments 802D"). In this example, data fragment 802P serves as a parity block that may be used to recover any of data fragments 802D that may become unavailable.

In the example of FIG. 6B, an in accordance with one or more aspects of the present disclosure, access node 17 may store data fragments derived from data 801 across network 8. For instance, in the example of FIG. 6A, access node 17 receives data 801 from server 12. Access node 17 outputs data 801 to accelerator 200. Accelerator 200 passes data 801 through data durability block 206, which splits data 801 into five equal-sized or approximately equal-sized data fragments 802. In other examples, data durability block 206 may split data 801 into a different number of fragments. Data durability block 206 creates data fragment 802P by applying a simple parity encoding algorithm.

In some examples, data durability block 206 may, to implement the parity encoding algorithm, generate data fragment 802P based on a simple odd/even parity scheme. For instance, to generate data fragment 802P from data fragments 802D, and in a simplified example involving equal-sized data fragments 802D, one bit from each of data fragments 802D is used to form a collection of bits. A parity or check bit for the collection of bits is generated based on whether the total number of "1" bits in the collection of bits is odd or even. For instance, for an odd parity scheme, if the number of "1" bits in the collection of bits is even, data durability block 206 generates a "1" parity bit, and if the number of "1" bits is odd, data durability block 206 generates a "0" parity bit. Data durability block 206 continues this process for each respective bit in each of the equal-sized data fragments 802D. Data durability block 206 combines the resulting check bits generated from the collection of bits from data fragments 802D to form data fragment 802P, also having a size equal to the size of each of data fragments 802D.

An even parity scheme would operate in a manner similar to the odd parity scheme example described above. For an even parity scheme, data durability block 206 may generate a "0" parity bit for each collection of bits from data fragments 802D that has an even number of "1" bits, and may generate a "1" parity bit for each collection of bits having an odd number of "1" bits. In such an example, data durability block 206 combines the resulting check bits to form the corresponding data fragment 802P.

Once data fragment 802P is encoded and stored pursuant to either an even or odd parity scheme, if one of data fragments 802D is lost, data durability block 206 may use the parity bits in data fragment 802P (along with an indication that the parity bits in data fragment 802D were generated pursuant to an odd parity scheme) to reconstruct the lost data fragment 802D. As a result, data durability block 206 may be capable of recovering any one of data fragments 802D if data fragment 802P is available.

After data durability block 206 creates data fragment 802P, access node 17 outputs data fragment 802P and each of data fragments 802D over switch fabric 14, and stores each data fragment within a different fault domain (e.g., different racks 70) across network 8. If one of data fragments 802D later fails or becomes unavailable, access node 17 may, in order to access data 801, recover the unavailable data fragment 802D by reading from the remaining available data fragments 802D and also data fragment 802P. Data durability block 206 generates the missing data fragment 802D from the remaining data fragments 802D and data fragment 802P pursuant to the parity decoding procedures described above.

The simple parity data durability scheme illustrated in FIG. 6B and described above requires very low storage resources, since only a small amount of storage overhead is required (in the example of FIG. 6B, the additional storage overhead is ⅕ or 20%). Further, the computing complexity is relatively low, and may require only exclusive-or operations and/or binary addition operations. However, the system of FIG. 6B typically will only tolerate loss of one of data fragments 802D. In other words, if one data fragment (any of data fragment 802P and data fragments 802) is unavailable, the missing data fragment can be reconstructed from the remaining data fragments. However, if more than one data fragment is lost, the system of FIG. 6B might be unable to fully reconstruct the original data 801.

Figure 6C:
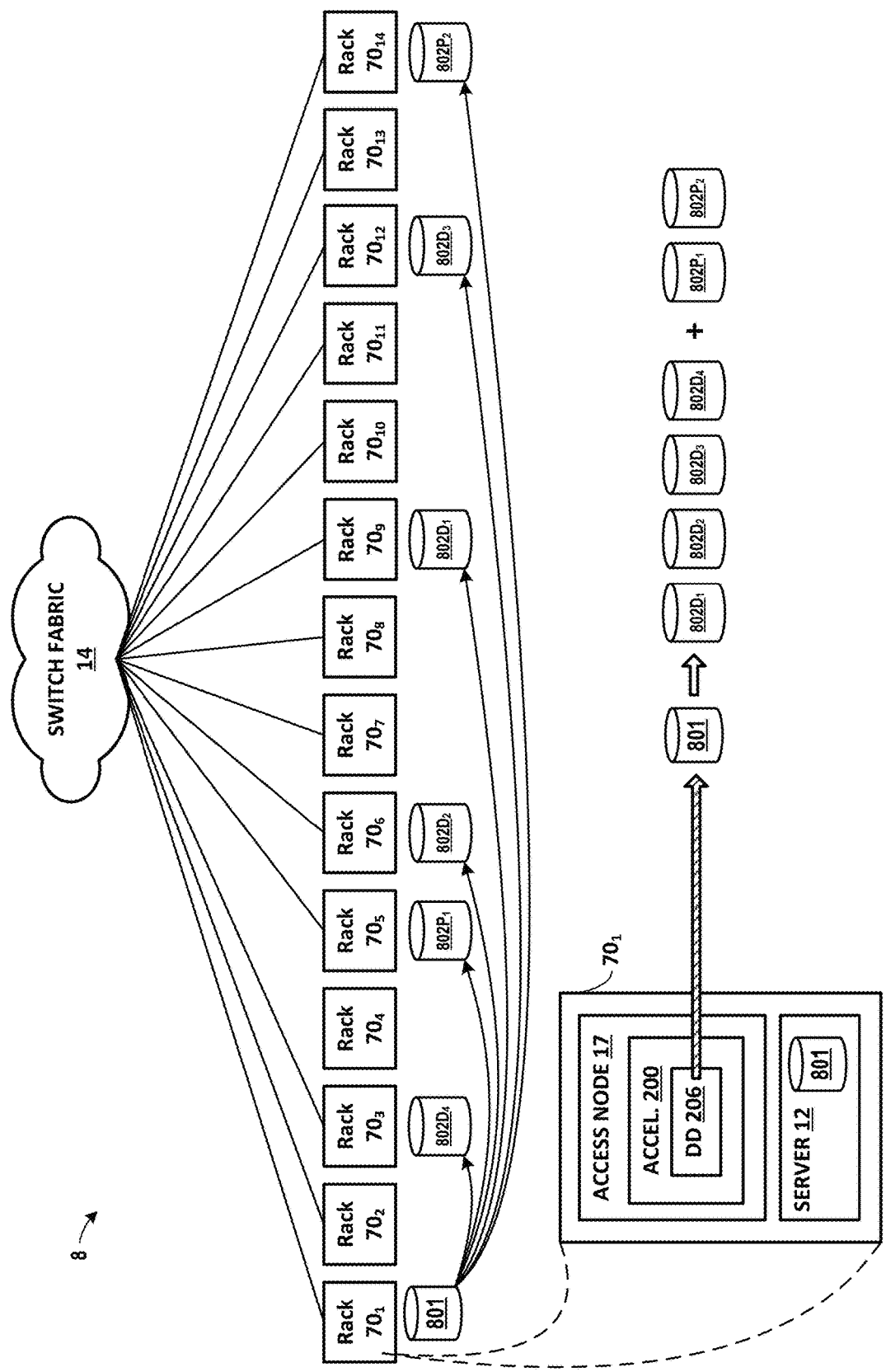
FIG. 6C is a conceptual diagram illustrating an example write operation performed pursuant to an erasure coding data reliability scheme, in accordance with one or more aspects of the present disclosure.

FIG. 6C is a conceptual diagram illustrating an example write operation performed pursuant to an erasure coding data reliability scheme, in accordance with one or more aspects of the present disclosure. As in FIG. 6A and FIG. 6B, FIG. 6C includes a number of racks 70 connected through switch fabric 14, each of racks 70 including one or more access nodes 17 and one or more servers 12. In FIG. 6C, data durability block 206 is configured to apply an erasure coding approach to data durability. Erasure coding is a method of data protection in which data is broken into fragments, expanded and encoded with redundant data pieces. Erasure codes enable data fragments that become corrupted at some point in the storage process to be reconstructed by using information about the data that is stored elsewhere. If some combination of one or more of the data fragments are erased or are otherwise unavailable, but the remaining data blocks are available, the erased or unavailable data blocks can be reconstructed from the available blocks.

In some examples, an erasure coding algorithm splits data blocks into "d" data blocks and "p" parity blocks. A Reed Solomon 4+2 erasure coding scheme, for example, uses d=4 data blocks to generate p=2 parity blocks. Many other Reed Solomon implementations are possible, including 12+3, 10+4, 8+2, and 6+3 schemes. Other types of erasure encoding schemes beyond Reed Solomon schemes include parity array codes (e.g., EvenOdd codes, X codes, HoVer codes, WEAVER codes), Low Density Parity Check (LDPC) codes, or Local Reconstruction Codes (LRC). In some cases, such for parity array codes, reliability schemes may be more restrictive in terms of an ability to recover from failure for a given set of unavailable data fragments or data blocks. Further, data recovery for parity array codes may be iterative if more than one data fragment or data block is unavailable; such iterative data recovery may involve time-consuming and/or inefficient processing, thereby leading to latency and/or poor performance.

In the example of FIG. 6C, an in accordance with one or more aspects of the present disclosure, access node 17 may store, across network 8, data fragments generated pursuant to an erasure encoding scheme. For instance, in the example of FIG. 6C, access node 17 receives data 801 from server 12. Access node 17 outputs data 801 to accelerator 200. Accelerator 200 feeds data 801 through data durability block 206, which splits data 801 into data fragments 802D-1, 802D-2, 802D-3, 802D-4, and 802D-5 (collectively "data fragments 802D"). Data durability block 206 applies an erasure coding encoding algorithm to generate data fragment 802P-1 and data fragment 802P-2 (collectively "data fragments 802P") from data fragments 802D. Access node 17 stores data fragments 802D and data fragments 802P within different failure domains (e.g., racks 70) across network 8. If one or more of data fragments 802D or data fragments 802P become unavailable, access node 17 may recover data 801 by reading from the remaining available data fragments (which may be a combination of data fragments 802D and/or data fragments 802P) stored on the network.

The erasure coding scheme illustrated in FIG. 6C involves relatively low storage costs, since only a small amount of storage overhead is required (in the example of FIG. 6B, the additional storage overhead is 2/4 or 50%). Further, the system of FIG. 6B will tolerate more than the loss of one data fragment. For example, a Reed Solomon 4+2 erasure coding scheme generates two parity blocks (p=2) for each set of four data blocks (d=4). And in general, such an erasure coding scheme can correct a number of erasures less than or equal to "p." So for the 4+2 system of FIG. 6C, the loss or unavailability of any two of data fragments (any combination of data fragment 802D and/or data fragments 802P) still enables data 801 to be fully recovered by decoding the remaining data fragments. Unavailability of any three data fragments, however, may result in data loss. Similarly, for a 12+3 Reed Solomon system, unavailability of any three data or parity fragments still enables the original data to be reconstructed from the remaining fragments, but unavailability of four or more fragments may result in data loss.

One of the drawbacks of erasure coding systems is complexity, and encoding and decoding data using an erasure coding scheme may require high computing resources, complexity, and/or costs. For example, a Reed Solomon erasure coding scheme is typically implemented using Galois Field mathematics, and many current processors are not well equipped to perform Galois Field mathematics operations efficiently. Complexity, computing resources, and/or inefficiency may affect performance, and/or increase latency of operations on network 8. To address these issues, data durability block 206 may be configured and/or equipped, in some examples, to process Galois Field mathematical operations efficiently, and may include specialized circuitry or logic that enables efficient performance of operations involved in encoding and/or decoding Reed Solomon erasure codes. In examples described herein, one or more of servers 12 may effectively offload, to access node 17 (or to data durability block 206), some or all of the computing operations that might otherwise be performed by one or more of servers 12 to implement an erasure coding system. By offloading the performance of such operations to access node 17, each of servers 12 may operate more efficiently. In some examples, access node 17 may perform data durability operations (data encoding, data decoding, and recovery) as a transparent process on network traffic (e.g., transparent to cores 140 of FIG. 2 and/or cores 182 of FIG. 4).

Figure 7A:
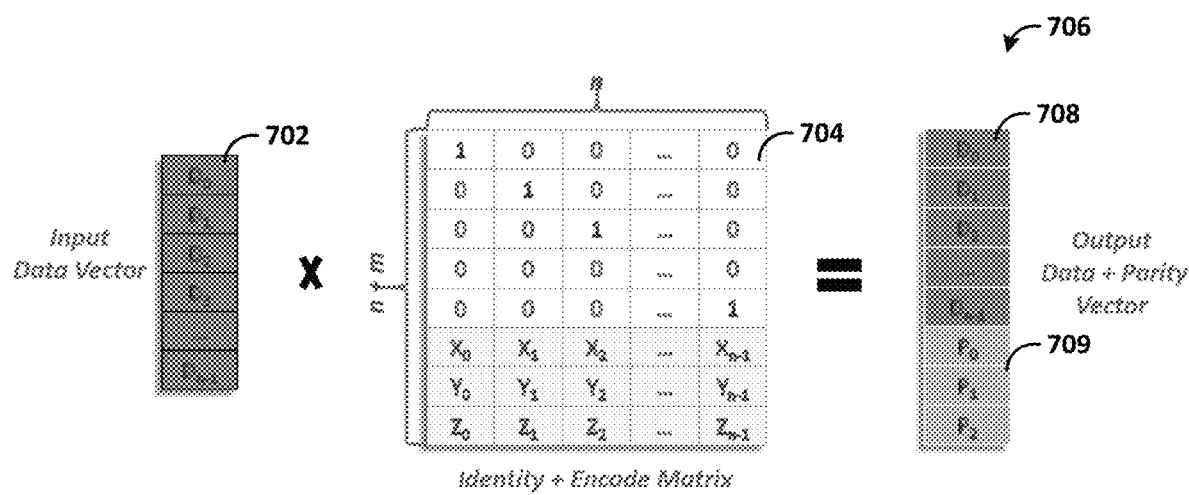
FIG. 7A is a conceptual diagram illustrating a matrix operation that may be used for encoding data pursuant to a Reed-Solomon data reliability scheme, in accordance with one or more aspects of the present disclosure.

FIG. 7A is a conceptual diagram illustrating a matrix operation that may be used for encoding data pursuant to a Reed-Solomon data reliability scheme, in accordance with one or more aspects of the present disclosure. FIG. 7A illustrates input vector 702 and matrix 704. Input vector 702 includes a number of data fragments (e.g., corresponding to data fragments 802D in FIG. 6C) generated by splitting data (e.g., data 801) into a number of equal-sized fragments. Matrix 704 has dimensions of n×(n+m). The upper portion of matrix 704 includes an identity matrix, and the lower portion of matrix 704 includes an encoding matrix.

In the example of FIG. 7A, an in accordance with one or more aspects of the present disclosure, access node 17 may encode data. For instance, in an example that can be described with reference to FIG. 6C and FIG. 7A, data durability block 206 performs a Reed Solomon encode operation by multiplying input vector 702 and matrix 704 to generate output vector 706. Data durability block 206 performs such a matrix multiplication operation pursuant to known principles of Galois Field mathematics. The resulting output vector 706 includes output data blocks 708 (e.g., corresponding to data fragments 802D) and output parity blocks 709 (e.g., corresponding to data fragments 802P) of FIG. 6C. Each of output parity blocks 709 may be the result of a vector dot product of input vector 702 with coefficients in matrix 704. In some examples, data durability block 206 may perform a modified and/or streamlined matrix multiplication operation that takes advantage of certain efficiencies resulting from the fact that a portion of matrix 704 is, as in FIG. 7A, an identity matrix.

Figure 7B:
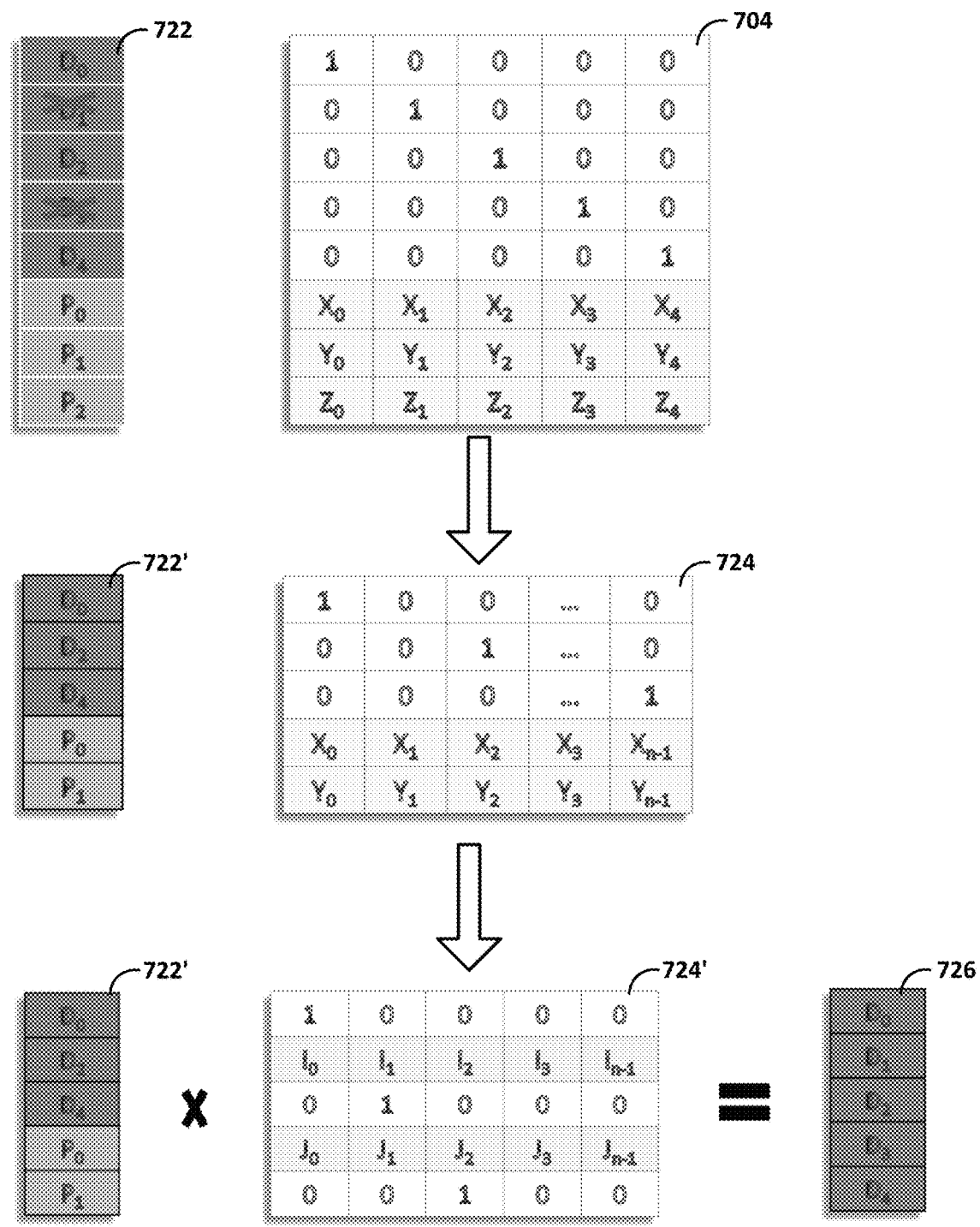
FIG. 7B is a conceptual diagram illustrating a matrix operation that may be used for decoding data that has been encoded pursuant to a Reed-Solomon data reliability scheme, in accordance with one or more aspects of the present disclosure.

FIG. 7B is a conceptual diagram illustrating a matrix operation that may be used for decoding data that has been encoded pursuant to a Reed-Solomon data reliability scheme, in accordance with one or more aspects of the present disclosure. FIG. 7B illustrates recovery vector 722 and matrix 704. Modified recovery vector 722' includes a subset of the data blocks and parity blocks from the original input vector (i.e., vector 722). In the example shown, recovery vector 722' includes only D0, D2, D4, P0, and P1. Matrix 724 is derived from matrix 704 based on the subset of data blocks included in modified recovery vector 722', and has dimensions corresponding to the size of modified recovery vector 722'.

In the example of FIG. 7B, an in accordance with one or more aspects of the present disclosure, access node 17 may reconstruct, from modified recovery vector 722', input vector 702 shown in FIG. 7A (assuming that in FIG. 7A, n=5 and a 5+3 Reed Solomon scheme is being used). For instance, with reference to FIG. 6C and FIG. 7B, data durability block 206 identifies the available data blocks corresponding to input vector 702. In the example of FIG. 7B, the available data blocks are D0, D2, and D4. Data durability block 206 determines that D1 and D3 are not available. Data durability block 206 also identifies available parity blocks, and in the example of FIG. 7B, identifies P0 and P1 as being available. Data durability block 206 constructs modified recovery vector 722' from the available data and parity blocks. Data durability block 206 generates matrix 724 by selecting rows from the original encode matrix 704. The rows selected by data durability block 206 are based on the data and/or parity blocks that are or are not available. Data durability block 206 processes matrix 724 to generate decode matrix 724', and performs a vector dot product of modified recovery vector 722' and decode matrix 724' to generate the original input vector, using, for example, known principles of Galois Field mathematics. As a result, data durability block 206 generates vector 726, which would be the same as input vector 702 from FIG. 7A, assuming n=5 in FIG. 7A.

Figure 7C:
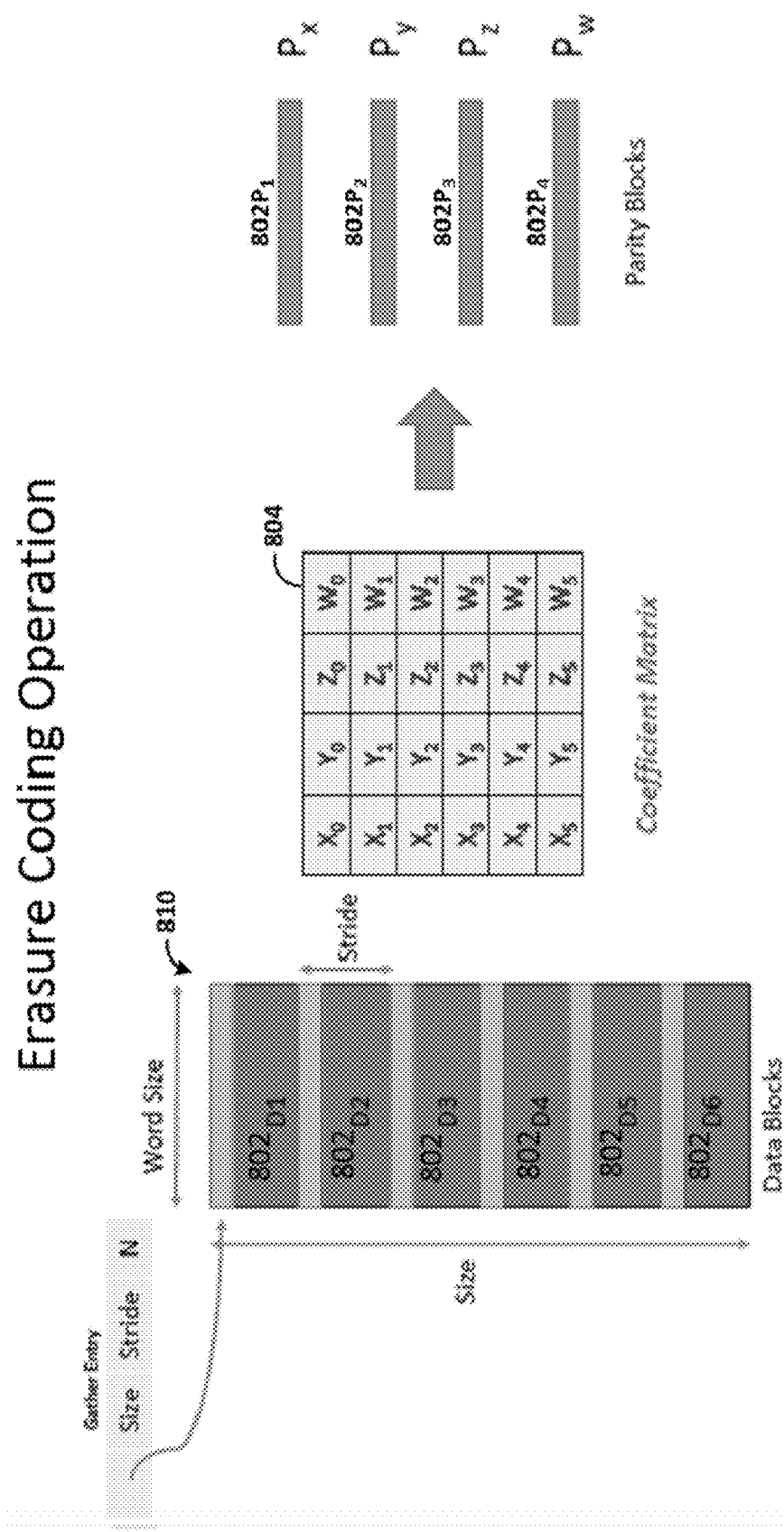
FIG. 7C is a conceptual diagram illustrating a strided read operation that may be used to generate parity blocks, in accordance with one or more aspects of the present disclosure.

FIG. 7C is a conceptual diagram illustrating a strided read operation that may be used to generate parity blocks, in accordance with one or more aspects of the present disclosure. The example of FIG. 7C illustrates a Reed Solomon 6+4 encoding operation in which six data fragments 802D-1 through 802D-6 (collectively "data fragments 802D") are used to generate four parity data fragments 802P-1 through 802-4 (collectively "data fragments 802P"). To perform the encoding operation, a matrix multiplication operation is performed involving data fragments 802D and coefficient matrix 804, which results in data fragments 802P.

FIG. 7C illustrates data fragments 802D arranged within storage 810, which may be storage at one or more locations within network 8, or storage within cache memory of accelerator 200 of FIG. 5, memory associated with a DMA inline accelerator, or other storage. In some examples, reading from storage 810 may be a costly and/or time-consuming operation, so it may be beneficial to limit the number times that read operations involving storage 810 are performed. However, during a Reed Solomon encode operation performed by data durability block 206 (e.g., as shown in FIG. 6C and FIG. 7A), generating each of data fragments 802P may involve reading segments of data from each of data fragments 802D multiple times. Accordingly, at least some implementations for generating data fragments 802P from data fragments 802D may involve many read operations.

To reduce the number of read operations performed involving data fragments 802D, data durability block 206 may, in some examples, read the data from each of data fragments 802D only a single time in succession, perform the matrix multiplication operations after reading the data for each of data fragments 802D, and then generate a partial result for each of data fragments 802D. Data durability block 206 may thereafter combine the partial results to generate each of data fragments 802P. However, while the number of times that read operations involving data fragments 802D may be reduced in such an implementation, the storage required for the partial results generated may be significant. Further, combining the partial results to generate each of data fragments 802P may also involve many read operations. If the partial solutions are stored in cache memory, a large amount of cache memory is required, which might not be an optimal solution. If the partial solutions are not stored in cache memory, but instead, are stored in secondary storage (e.g., on disk) then such an implementation is also not optimal, since combining the partial results to generate each of data fragments 802P may also involve many (relatively slow and/or costly) read operations.

In another example, illustrated in FIG. 7C, reducing the number of read operations when generating data fragments 802P from data fragments 802D may be achieved through a strided read operation involving reading portions of each of data fragments 802D. In some examples, performing a "strided" read operation involves reading a portion of data fragment 802D-1, and then jumping (by an offset or "stride" distance) to data fragment 802D-2, and then reading a corresponding portion of data fragment 802D-2. The process is continued until a corresponding portion of each of data fragments 802D has been read. In other words, after reading a portion of data fragment 802D-1 referenced by a pointer, the pointer is advanced a "stride" amount to data fragment 802D-2, a corresponding read is performed, and then the pointer is again advanced another stride to data fragment 802D-3. The process continues until the pointer references and reads from the final data fragment 802D-6. The effect of the strided read operations is that each of data fragments 802P fragments can be generated by using just a portion of each block, and by reading only the required portion of each of data fragments 802D (which happens to correspond to each of the strided read operations), each of data fragments 802P can be created in succession with a reduced number of read operations, and requiring relatively little or no intermediate storage.

Accordingly, data durability block 206 may generate data fragments 802P through a strided read operation of data fragments 802D. For instance, in the example of FIG. 7C, and with reference to FIG. 6C, data durability block 206 accesses a pointer that references a subset of data from data fragment 802D-1. Data durability block 206 reads the referenced data and performs a matrix multiplication operation pursuant to an erasure coding encode operation. Data durability block 206 then updates the pointer to reference a subset of data from data fragment 802D-2. Data durability block 206 reads the referenced data from data fragment 802D-2, effectively jumping from data fragment 802D-1 to data fragment 802D-2, rather than reading data fragment 802D-1 serially. After each read operation, data durability block 206 performs a matrix multiplication using the read data, and then updates the pointer to point to a subset of data within the next data fragments 802D. This process continues until a subset of data from each of data fragments 802D has been accessed, and an appropriate matrix multiplication operation has been performed. Data durability block 206 may repeat similar read operations involving other subsets of each of data fragments 802D until sufficient data is read to generate one of data fragments 802P. Data durability block 206 then generates one of data fragments 802P, and then begins a new set of strided read operations to generate another one of data fragments 802P in a similar manner. This process is completed until all of data fragments 802P are generated. In such an implementation, it may be possible to read each subset of data from each of data fragments 802D only a single time (or a small number of times), but the amount of intermediate storage required to generate each of data fragments 802P is also reduced.

Performing some types of erasure coding operations, such as Reed Solomon erasure coding, may involve applications of Galois Field mathematics. In Galois Field arithmetic, add and subtract operations are simply XOR operations, but multiplication and division are complicated, and often not well supported by commercial processing circuitry. Division may be performed by multiplication operations with the inverse value. Multiplication operations may be performed in one of a few different ways. In one option, the numbers or parameters to be multiplied are viewed as polynomials, and are multiplied accordingly. In another option, a table lookup is used, but the size of the table grows exponentially with the size of the values being multiplied. For some word sizes, the size of the table may be impractical and/or prohibitive.

In yet other options, it may be possible to translate multiplication operations into XOR operations of elements. In one such option, multiplication operations may be performed using a much smaller table, taking advantage of the observation that a multiplication operation, such as 0xAB*0X34 may be rewritten as 0xAB*0x30+0xAB*0x04. Such a table may have a size suitable for practical implementations. In a second such option, two lookup tables are used, one for each static coefficient, of 16 values each. One of the tables is used to multiply values with the lower portion of the data byte (0x01, 0x02, 0x03 ... 0x0F). The other table is used to multiply values with the upper portion of the data byte (0x10, 0x20, 0x30 ... 0xF0). Using one or more of such techniques for Galois Field multiplications, operations may be performed as a stateless operation, suitable for a DMA inline accelerator. Such operations may be capable of being generalized as vector dot product operations in Galois Field, using two lookups in two 16-byte tables, followed by XOR operations. In some examples, as each of data fragments 802P is generated, data durability block 206 outputs one of data fragments 802P to scatter block 212 of FIG. 5. Scatter block 212 outputs data fragments 802P to access node 17. Access node 17 writes or stores each of data fragments 802P in a different failure domain within network 8 as illustrated in FIG. 6C.

In FIG. 7C, and in some examples, matrix 804 may be stored in on chip memory, within accelerator 200, for efficient parity calculation. For smaller block sizes this might result in latency. To counter this, accelerator 200 may support two modes: (1) LOAD Only, and (2) LOAD and COMPUTE.

The LOAD only mode provides a method to keep the coefficient in SRAM and software executing on access node 17 (or data durability block 206) may issue multiple encode commands based on loaded coefficient. The LOAD and COMPUTE method provides a mechanism to pass data blocks along with the coefficient matrix and perform the compute. Data durability block 206 may, in some examples, provide a fully software addressable memory in which software can load multiple coefficient matrices and partition memory for LOAD only and LOAD and COMPUTE. This allows a flexibility for software to work in both modes in parallel on different data sets.

Figure 7D:
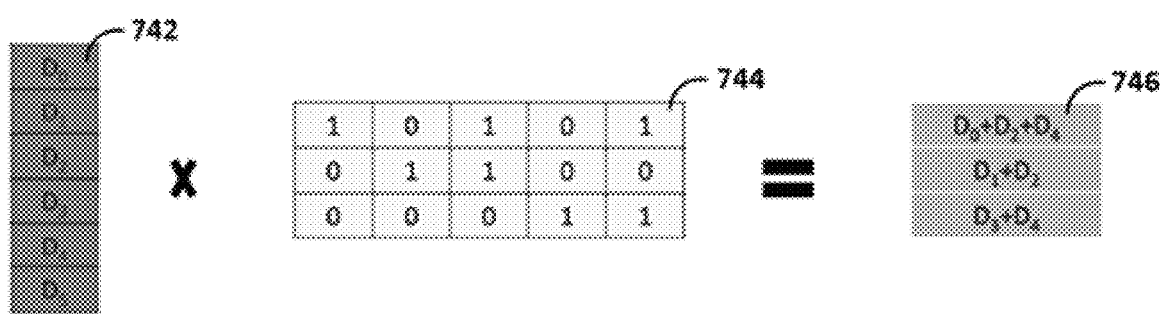
FIG. 7D is a conceptual diagram illustrating a matrix operation that may be used for encoding and/or decoding data pursuant to a parity array coding scheme, in accordance with one or more aspects of the present disclosure.

FIG. 7D is a conceptual diagram illustrating a matrix operation that may be used for encoding and/or decoding data pursuant to a parity array coding scheme, in accordance with one or more aspects of the present disclosure. The example of FIG. 7D illustrates that other data durability schemes and/or erasure coding algorithms, beyond Reed Solomon schemes, such as parity array codes, can be implemented using matrix operations. In general, in some parity array erasure coding schemes, each of the parity blocks is generated using data from only a subset of the data blocks (rather than, for example, generating the parity blocks based on data from all of the data blocks). For example, for erasure codes based on the EvenOdd coding algorithm, the X Code algorithm, and HoVer Codes algorithm, parity blocks are generated based on subsets of data blocks. Generating parity blocks for such erasure coding schemes therefore may involve selection of subsets of the data blocks, which is an operation that matrices can be used to perform. By choosing or generating an appropriate matrix, as illustrated in FIG. 7D, the data blocks or fragments used to generate each of the parity blocks can be selected.

Accordingly, data durability block 206 may apply a common matrix approach to both encoding and decoding parity blocks for a wide variety of erasure coding schemes. For instance, in the example of FIG. 7D, and with reference to FIG. 6C, data durability block 206 identifies, through input or a configuration setting, the type of erasure coding scheme being used. If data durability block 206 determines that the Reed Solomon algorithm is being used, data is encoded and/or decoded in the manner illustrated in FIG. 7A, FIG. 7B, and FIG. 7C. If data durability block 206 determines that a different type of erasure coding algorithm is being used, such as a parity array coding algorithm data durability block 206 generates or accesses a matrix having the form of matrix 744. Matrix 744 may be specific to the particular algorithm being used, and is chosen (or generated) based on the combinations of data blocks that the algorithm uses to generate parity blocks.

For instance, in the example of FIG. 7D, the erasure coding algorithm being employed uses D0, D2, and D4 to generate a first parity block within output vector 746. Further, the erasure coding algorithm uses D1 and D2 to generate a second parity block within output vector 746, and uses D3 and D4 to generate a third parity block within output vector 746. Accordingly, matrix 744 is configured or chosen to ensure that these combinations of data blocks result from a vector dot product of input vector 742 and matrix 744, effectively operating as a bit map that selects which of the data blocks to include in exclusive or operations (XOR) performed by data durability block 206. Once matrix 744 is chosen based on the algorithm in use, data durability block 206 performs the vector dot product of input vector 742 and matrix 744, which results in output vector 746.

By selecting an appropriate coefficient matrix, a variety of erasure coding algorithms can be implemented through matrix operations, thereby enabling some or all erasure coding algorithms to be performed by applying a common matrix approach. In such an implementation, the coefficient matrix may differ from algorithm to algorithm, but some or all of the matrix operations may be implemented or performed in the same way. Further, in some or all cases, the same matrix 744 may be used for both encoding and decoding operations, and matrix 744 may later therefore be used to reconstruct input vector 742 from a subset of the data blocks and the parity blocks generated earlier using matrix 744.

Figure 8A:
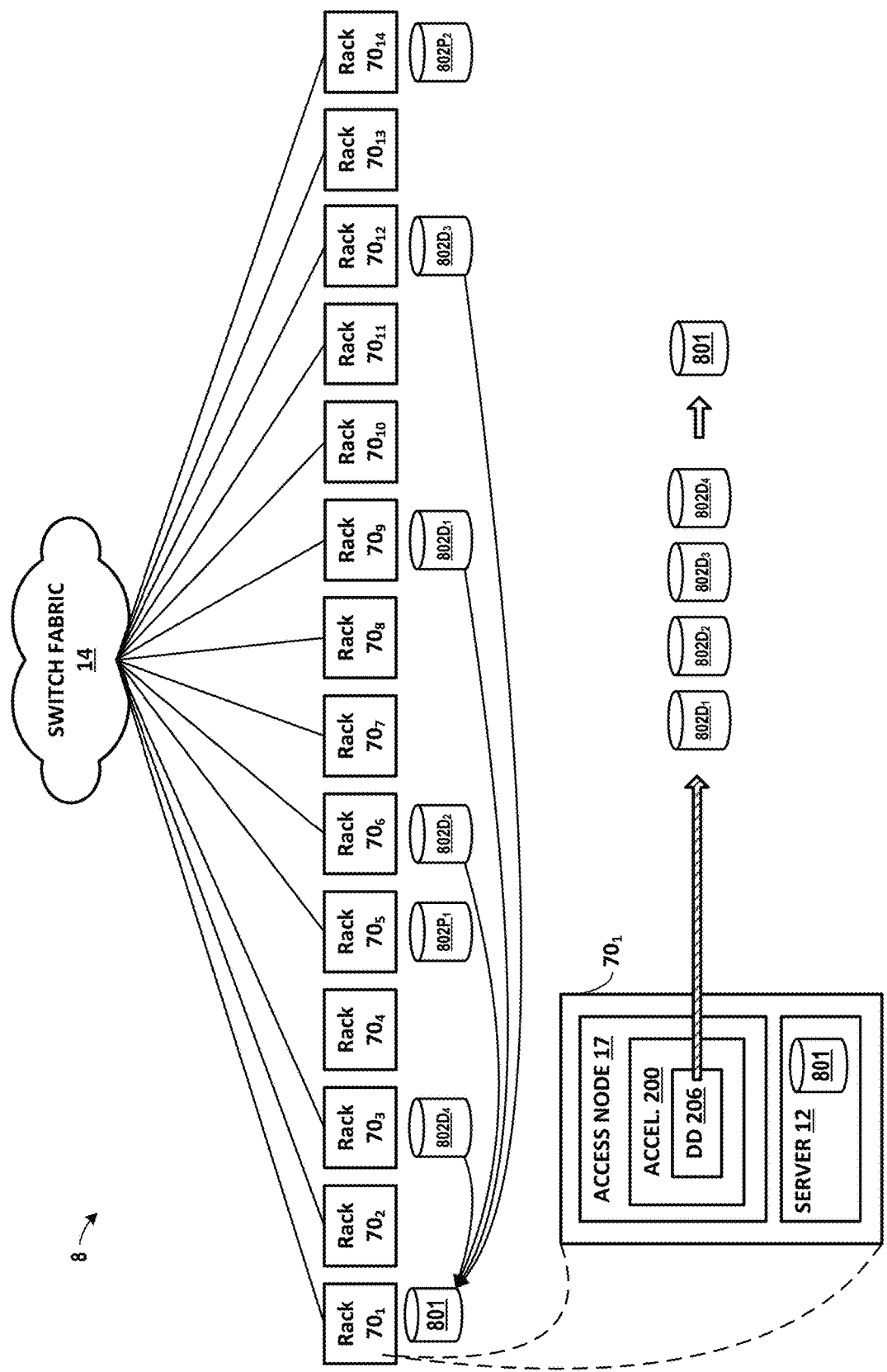
FIG. 8A is a block diagram illustrating example operations on a network in which stored data fragments are read from locations on the network, in accordance with one or more aspects of the present disclosure.

FIG. 8A is a block diagram illustrating example operations on a network in which stored data fragments are read from locations on the network, in accordance with one or more aspects of the present disclosure. In the example of FIG. 8A, it is assumed that access node 17 has previously applied a 4+2 erasure coding algorithm to split data 801 into four data fragments 802D, generated two data fragments 802P, and stored each of data fragments 802D and data fragments 802P across network 8 in the manner illustrated. Specifically, data fragment 802D-1 has been stored at rack 70-9, data fragment 802D-2 has been stored at rack 70-6, data fragment 802D-3 has been stored at rack 70-12, data fragment 802D-4 has been stored at rack 70-3. Further, data fragment 802P-1 has been stored at rack 70-5 and data fragment 802P-2 has been stored at rack 70-14.

In the example of FIG. 8A, and in accordance with one or more aspects of the present disclosure, access node 17 may perform a read operation and reconstruct data 801D from data fragments 802D. For instance, in the example of FIG. 8A, access node 17 receives a request for data 801. Access node 17 accesses a directory, stored within access node 17 or elsewhere, identifying where each of data fragments 802D are stored. Access node 17 determines whether each of data fragments 802D are available. Access node 17 determines that each of data fragments 802D are available, and accesses and/or retrieves each of data fragments 802D at the locations illustrated in FIG. 8A. Since each of data fragments 802D are available, access node 17 does not need to access any of data fragments 802P. Access node 17 reconstructs data 801 by combining each of data fragments 802D. In some examples, access node 17 may be able to reassemble data 801 by simply stitching each of data fragments 802D together to form data 801, without having to perform decoding operations pursuant to the data durability scheme implemented in network 8. Access node 17 responds to the request for data 801 by outputting the reassembled data 801.

Figure 8B:
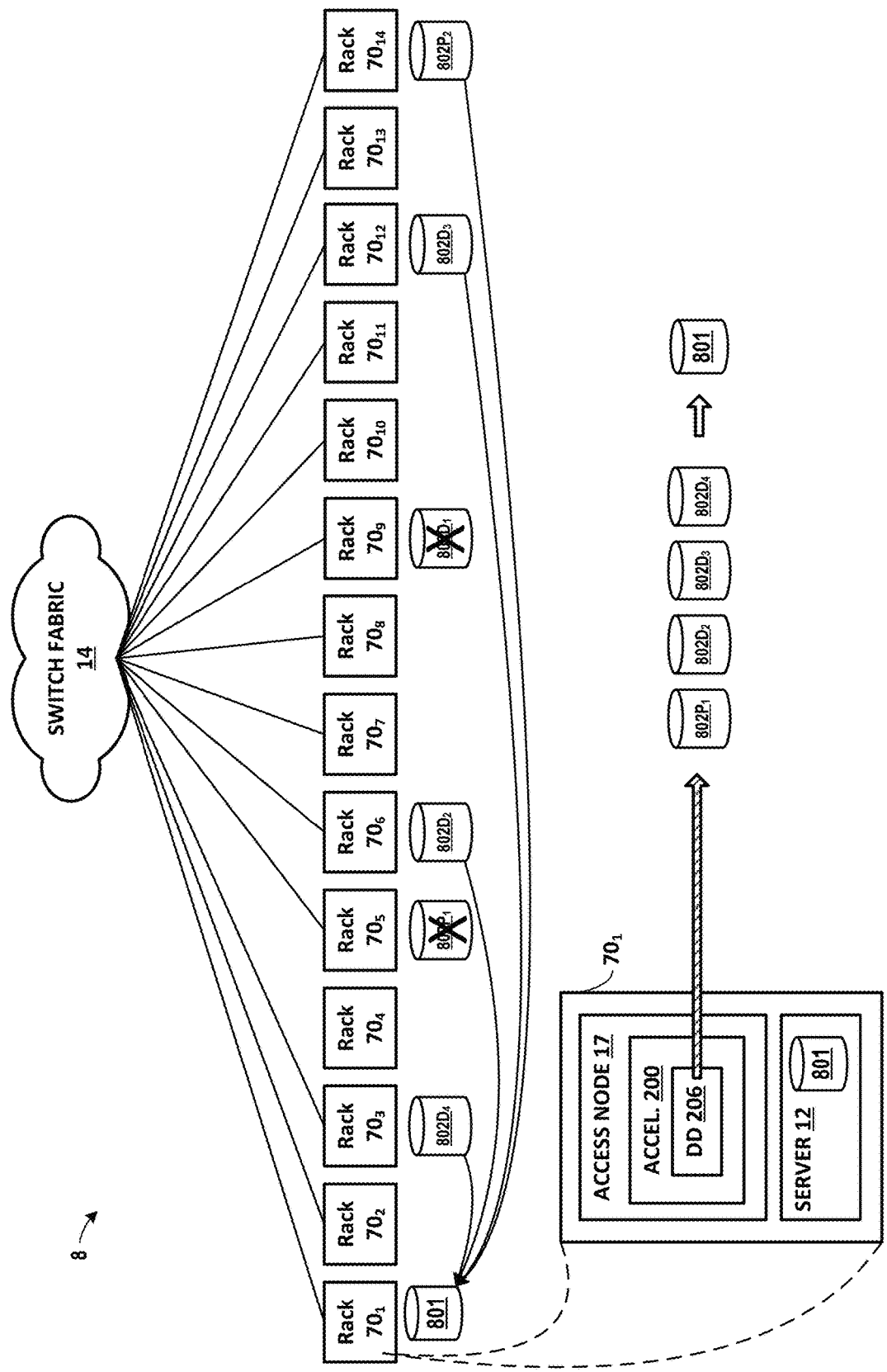
FIG. 8B is a block diagram illustrating an example read operation on a network in which some data fragments stored on the network are unavailable, in accordance with one or more aspects of the present disclosure.

FIG. 8B is a block diagram illustrating an example read operation on a network in which some data fragments stored on the network are unavailable, in accordance with one or more aspects of the present disclosure. As in FIG. 8A, in FIG. 8B, it is assumed that access node 17 has split data 801 into four data fragments 802D, has generated two data fragments 802P, and has stored each of data fragments 802D and data fragments 802P across network 8 in the manner illustrated. However, due to a hardware or software error, or due to some other reason, data fragment 802P-1 stored at rack 70-5 is not available, and data fragment 802D-1 stored at rack 70-9 is not available.

In the example of FIG. 8B, and in accordance with one or more aspects of the present disclosure, access node 17 may perform a read operation and reconstruct data 801D from available data fragments, including one or more of data fragments 802D and data fragments 802P. For instance, in the example of FIG. 8A, access node 17 receives a request for data 801. Access node 17 accesses a directory, stored within access node 17 or elsewhere, identifying where each of data fragments 802D are stored. Access node 17 determines that data fragment 802D-2, data fragment 802D-3, and data fragment 802D-4 are available, but that data fragment 802D-1, stored at rack 70-9, is not available. Access node 17 accesses and/or retrieves data fragment 802D-2, data fragment 802D-3, and data fragment 802D-4 over network 8. Access node 17 further accesses and/or retrieves data fragment 802P-2 over network 8. Access node 17 passes the accessed data to accelerator 200. Accelerator 200 causes data durability block 206 to reconstruct data 801 from the accessed data. In some examples, data durability block 206 performs erasure decoding operations (e.g., a Reed Solomon 4+2 decode operation) to reconstruct data 801. Access node 17 responds to the request for data 801 by outputting the reconstructed data 801.

Figure 9A:
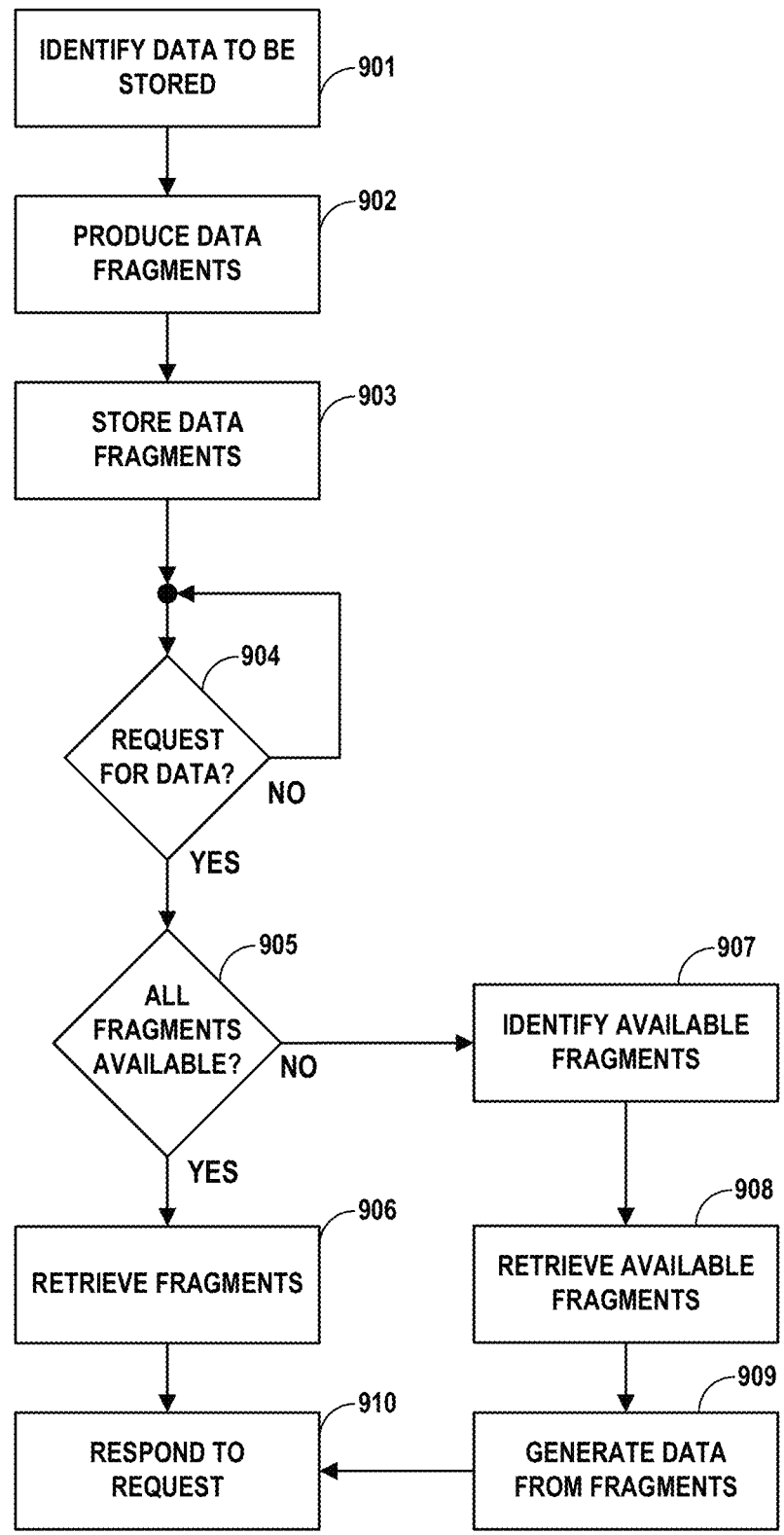
FIG. 9A is a flow diagram illustrating inline reliability coding operations performed by an example access node in accordance with one or more aspects of the present disclosure.

FIG. 9A is a flow diagram illustrating inline reliability coding operations performed by an example access node in accordance with one or more aspects of the present disclosure. FIG. 9A is described below within the context of access node 17 of FIG. 6C and FIG. 8B. In other examples, operations described in FIG. 9A may be performed by one or more other components, modules, systems, or devices. Further, in other examples, operations described in connection with FIG. 9A may be merged, performed in a difference sequence, omitted, or may encompass additional operations not specifically illustrated or described.

In the example of FIG. 9A, and in accordance with one or more aspects of the present disclosure, access node 17 may identify data to be stored (901). For instance, in an example that can be described in connection with FIG. 6C, access node 17 receives, from server 12, data 801. Access node 17 identifies data 801 as data intended for storage.

Access node 17 may produce a plurality of data fragments (902). For instance, in some examples, logic within access node 17 outputs data 801 to accelerator 200. Within accelerator 200, data durability block 206 (see FIG. 5) processes data 801 by splitting data 801 into data fragment 802D-1, data fragment 802D-2, data fragment 802D-3, and data fragment 802D-4 (collectively "data fragments 802D"). In addition, data durability block 206 generates, using a Reed-Solomon erasure code algorithm, data fragment 802P-1 and data fragment 802P-2 (collectively "data fragments 802P"), which are parity blocks that may be used to recover one or more of data fragments 802D if one or more of data fragments 802D are unavailable.

Access node 17 may store the data fragments on the network (903). For instance, in some examples, access node 17 chooses a set of failure domains for storing each of data fragments 802D and data fragments 802P. In the example of FIG. 6C, each of racks 70 is defined as a failure domain. Access node 17 stores each of data fragments 802D and data fragments 802P in a different rack 70, as shown in FIG. 6C. In other examples, a failure domain may be defined more narrowly, such that a failure domain is a sub-rack or logical rack within each of racks 70. In such an example, more than one of data fragments 802D or data fragments 802P may be stored on the same rack 70. In still other examples, a failure domain may be defined more broadly, so that a failure domain encompasses more than one racks 70, so that no more than one data fragments 802D or data fragments 802P are stored within the same set of racks 70 that compose a failure domain.

Access node 17 may receive a request to access data stored on the network (904). For instance, now referring to FIG. 8B, and some period of time after the data fragments corresponding to data 801 are stored on the network, access node 17 receives a request to access data 801. In some examples, the request may originate from the same server 12 that originally sent the data to access node 17. In other examples, the request may originate from a different server or from a different device.

Access node 17 may determine whether one or more of data fragments 802D are available (905). For instance, with reference to FIG. 8B, access node 17 accesses a directory identifying where each of data fragments 802D are stored. Access node 17 determines whether each of data fragments 802D stored at the identified location is available. If access node 17 determines that each of data fragments 802D are available, access node 17 accesses each of data fragments 802D at their respective identified location (906). In some situations, however, access node 17 determines that at least one of data fragments 802D is not available. In the example of FIG. 8B, access node 17 determines that data fragment 802D-1 and data fragment 802P-1 are both unavailable. One or more of data fragments 802D may be unavailable for a number of reasons, including hardware or software error, or due to temporarily unavailability of one or more of racks 70 or portions of one or more of racks 70.

Access node 17 may identify a plurality of available fragments (907). For instance, still referring to FIG. 8B, access node 17 determines the location of one or more data fragments 802P. Access node 17 identifies data 801D-2, data 801D-3, data 801D-4, and data fragment 802P-2 as available data fragments.

Access node 17 may retrieve the available fragments over the network (908). For instance, in the example of FIG. 8B, access node 17 retrieves, over switch fabric 14 or otherwise, each of the four available fragments. Access node 17 may store each of the available fragments in memory within accelerator 200.

Access node 17 may generate data corresponding to data 801 from the available fragments (909). For instance, since in the example of FIG. 8B access node 17 can reconstruct data 801 based on any four of the data fragments in a collection consisting of data fragments 802D and data fragments 802P, access node 17 reconstructs data 801 from the available fragments. To do so, data durability block 206 of access node 17 processes the stored fragments (e.g., through an appropriate matrix operation pursuant to a 4+2 Reed-Solomon encoding scheme), and generates data 801. Data durability block 206 outputs the reconstructed data 801 to accelerator 200, which makes it available to access node 17.

Access node 17 may respond to the request to access the data (910). For instance, in some examples, access node 17 outputs data 801 to the device that requested data 801, such as server 12.

Figure 9B:
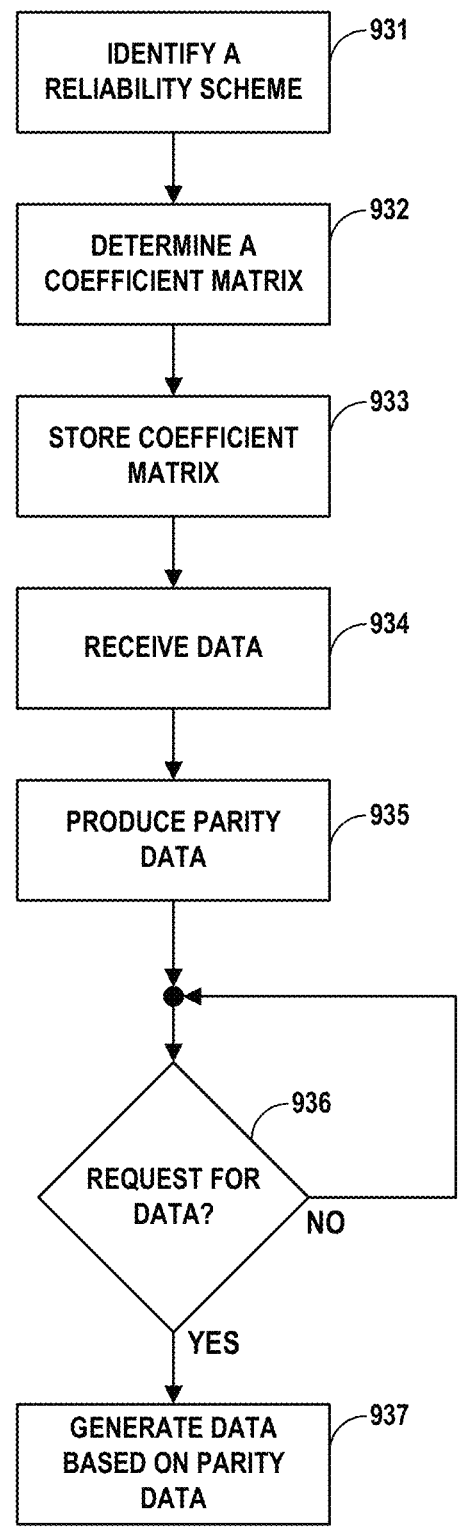
FIG. 9B is a flow diagram illustrating flexible data durability coding operations performed by an example access node in accordance with one or more aspects of the present disclosure.

FIG. 9B is a flow diagram illustrating flexible data durability coding operations performed by an example access node in accordance with one or more aspects of the present disclosure. FIG. 9B is described below within the context of access node 17 of FIG. 6C and FIG. 8B. In other examples, operations described in FIG. 9B may be performed by one or more other components, modules, systems, or devices. Further, in other examples, operations described in connection with FIG. 9B may be merged, performed in a difference sequence, omitted, or may encompass additional operations not specifically illustrated or described.

In the example of FIG. 9B, and in accordance with one or more aspects of the present disclosure, access node 17 may identify a reliability scheme (931). For instance, in an example that can be described in connection with FIG. 6C and FIG. 8B, access node 17 receives information identifying a reliability scheme that is used in network 8 and that has been chosen for use when storing data 801. In some examples, access node 17 receives the information in the form of input from an administrator, or access node 17 may access a configuration file, or access node 17 may detect an appropriate reliability scheme by observing operations within network 8, or access node 17 may identify a reliability scheme in another manner.

Access node 17 may determine a coefficient matrix (932). For instance, in some examples, access node 17 may determine, based on the identified reliability scheme, an appropriate coefficient matrix that can be used to implement the identified reliability scheme. In some examples, the coefficient matrix may be used to both encode and decode parity blocks or fragments derived from data 801. If the reliability scheme is a simple parity scheme, for example, access node 17 may generate or access a coefficient matrix consistent with the operations described in connection with FIG. 6A. If the reliability scheme is a Parity Array Codes erasure coding scheme, access node 17 may generate and use, for encoding and/or decoding operations, a coefficient matrix consistent with that described in connection with FIG. 7D. If the reliability scheme is a Reed-Solomon reliability scheme, access node 17 may generate or access a coefficient matrix consistent with the matrix described in connection with FIG. 7A, FIG. 7B, and FIG. 7C. In the example of FIG. 6C, a Reed-Solomon 4+2 reliability scheme is used, so access node 17 generates a coefficient matrix appropriate for that reliability scheme.

Access node 17 may store the coefficient matrix (933). For instance, in some examples, access node 17 stores the coefficient matrix used for the identified reliability scheme in memory so that it can be accessed when encoding and/or decoding data 801. Access node 17 may store the coefficient matrix in memory unit 183 (see FIG. 4A), or in other examples, access node 17 may store the coefficient matrix within storage included within accelerator 200 and/or data durability block 206 (see FIG. 5).

Access node 17 may receive data intended for storage (934). For instance, in some examples, access node 17 receives, from server 12, data 801. Access node 17 identifies data 801 as data intended for storage.

Access node 17 may produce data fragments 802P (935). For instance, in the example of FIG. 6C, access node 17 outputs data 801 to accelerator 200. Within accelerator 200, data durability block 206 (see FIG. 5) processes data 801 in a manner consistent with the identified reliability scheme. In the example of FIG. 6C, a Reed-Solomon 4+2 reliability scheme is used, so accelerator 200 splits data 801 into data fragment 802D-1, data fragment 802D-2, data fragment 802D-3, and data fragment 802D-4 (collectively "data fragments 802D"). In addition, data durability block 206 generates, using the stored coefficient matrix, data fragment 802P-1 and data fragment 802P-2 (collectively "data fragments 802P"). Access node 17 may store data fragments 802D and data fragments 802P in the manner illustrated in FIG. 6C.

Access node 17 may receive a request for data (936). For instance, referring now to FIG. 8B, access node 17 waits for a request for data, and some period of time after the parity data for data 801 is produced, access node 17 receives a request to access data 801. The request may originate from server 12, a different server, or from a different device.

Access node 17 may generate data corresponding to data 801 using the parity data (937). For instance, again referring to FIG. 8B, access node 17 reconstructs data 801 based on any four of the data fragments in a collection consisting of data fragments 802D and data fragments 802P, all of which are stored on different racks 70 in FIG. 8B. In the example of FIG. 8B, data durability block 206 of access node 17 reconstructs data 801 from data fragments 802D and data fragments 802P by reading data from network 8. If any of data fragments 802D are unavailable, data durability block 206 uses one or more of data fragments 802P to reconstruct data 801. To reconstruct the data, data durability block 206 uses available data fragments 802D and/or data fragments 802P and generates, by applying the stored coefficient matrix, data 801. Data durability block 206 outputs the reconstructed data 801 to accelerator 200, which makes it available to access node 17. Access node 17 outputs data 801 to the device that requested data 801.

For processes, apparatuses, and other examples or illustrations described herein, including in any flowcharts or flow diagrams, certain operations, acts, steps, or events included in any of the techniques described herein can be performed in a different sequence, may be added, merged, or left out altogether (e.g., not all described acts or events are necessary for the practice of the techniques). Moreover, in certain examples, operations, acts, steps, or events may be performed concurrently, e.g., through multi-threaded processing, interrupt processing, or multiple processors, rather than sequentially. Further certain operations, acts, steps, or events may be performed automatically even if not specifically identified as being performed automatically. Also, certain operations, acts, steps, or events described as being performed automatically may be alternatively not performed automatically, but rather, such operations, acts, steps, or events may be, in some examples, performed in response to input or another event.

The detailed description set forth above is intended as a description of various configurations and is not intended to represent the only configurations in which the concepts described herein may be practiced. The detailed description includes specific details for the purpose of providing a sufficient understanding of the various concepts. However, these concepts may be practiced without these specific details. In some instances, well-known structures and components are shown in block diagram form in the referenced figures in order to avoid obscuring such concepts.

In accordance with one or more aspects of this disclosure, the term "or" may be interrupted as "and/or" where context does not dictate otherwise. Additionally, while phrases such as "one or more" or "at least one" or the like may have been used in some instances but not others; those instances where such language was not used may be interpreted to have such a meaning implied where context does not dictate otherwise.

In one or more examples, the functions described may be implemented in hardware, software, firmware, or any combination thereof. If implemented in software, the functions may be stored, as one or more instructions or code, on and/or transmitted over a computer-readable medium and executed by a hardware-based processing unit. Computer-readable media may include computer-readable storage media, which corresponds to a tangible medium such as data storage media, or communication media including any medium that facilitates transfer of a computer program from one place to another (e.g., pursuant to a communication protocol). In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the terms "processor" or "processing circuitry" as used herein may each refer to any of the foregoing structure or any other structure suitable for implementation of the techniques described. In addition, in some examples, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, a mobile or non-mobile computing device, a wearable or non-wearable computing device, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperating hardware units, including one or more processors as described above, in conjunction with suitable software and/or firmware.

What is claimed is:

1. A method comprising:
    generating from a set of data, by data durability circuitry within a data processing unit, a plurality of data fragments, wherein generating the plurality of data fragments includes generating a plurality of data split fragments by splitting the set of data, and generating a plurality of parity fragments by applying an erasure coding algorithm, and
    wherein generating the plurality of parity fragments includes performing a plurality of strided read operations across the plurality of data split fragments, wherein the plurality of strided read operations includes reading, for each of the plurality of data split fragments, data at a stride offset relative to the beginning of each of the data split fragments;
    storing, by the data processing unit, the plurality of data fragments, wherein at least some of the plurality of data fragments is stored within a different fault domain, wherein each fault domain includes one or more hardware subsystems not included within any other of the fault domains;

receiving, by the data processing unit and from a requesting device, a request to access at least a portion of the set of data;

determining, by the data processing unit, that one or more of the plurality of data fragments is not available;

identifying, by the data processing unit, a plurality of available data fragments, wherein the plurality of available data fragments is a subset of the plurality of data fragments;

retrieving, by the data processing unit, at least a subset of the plurality of available data fragments over a network;

generating, by the data durability circuitry within the data processing unit, a reconstructed set of data from the available data fragments; and responding to the request by outputting, by the data processing unit, the reconstructed data.

2. The method of claim 1, wherein the set of data is from one or more of a plurality of servers, and wherein the requesting device is one of the plurality of servers.

3. The method of claim 1, wherein storing the plurality of data fragments includes:
storing each of the plurality of data fragments within a different fault domain on the network.

4. The method of claim 1, wherein generating the plurality of data fragments includes:
generating a plurality of data split fragments by splitting the set of data pursuant to a RAID encoding scheme, and
generating a plurality of parity fragments by applying an erasure coding algorithm.

5. The method of claim 1, wherein generating the plurality of parity fragments further includes:
storing, within contiguous memory and before performing the plurality of strided read operations, each of the plurality of data split fragments.

6. The method of claim 1, wherein generating the plurality of parity fragments further includes:
generating, as a result of each sequence of the strided read operations, one of the plurality of parity fragments without modifying any of the other plurality of parity fragments.

7. The method of claim 1, wherein the erasure coding algorithm is a Reed Solomon erasure coding algorithm.

8. The method of claim 1, wherein identifying the plurality of available data fragments includes identifying at least as many available data fragments as there are data split fragments.

9. The method of claim 1, wherein storing the plurality of data fragments includes:
storing all of the plurality of data fragments within a different fault domain on the network.

10. The method of claim 1, wherein storing the plurality of data fragments includes:
storing each of the plurality of data fragments within a different rack.

11. The method of claim 1, wherein a fault domain is defined as at least one of the following:
a network storage compute unit, a logical rack, or a physical rack.

12. The method of claim 1, wherein at least one of the stored plurality of data fragments is unavailable as a result of an administrative operation.

13. The method of claim 12, wherein the administrative operation is a software upgrade operation.

14. The method of claim 1, wherein the data durability circuitry within the data processing unit includes circuitry for efficiently performing matrix multiplication operations, and wherein generating the reconstructed set of data includes:
performing, by the circuitry, matrix multiplication operations.

15. The method of claim 1, wherein the data durability circuitry within the data processing unit includes circuitry for efficiently performing Galois Field mathematics operations, and wherein generating the reconstructed set of data includes:
performing, by the circuitry, Galois Field mathematics operations.

16. The method of claim 15, wherein performing the Galois Field mathematics operations include performing XOR operations and using at least one lookup table.

17. A data processing unit comprising:
at least one memory device;
data durability circuitry; and
processing circuitry capable of controlling the data durability circuitry and having access to the at least one memory device and configured to:
cause the data durability circuitry to generate, from a set of data, a plurality of data fragments, wherein generating the plurality of data fragments includes generating a plurality of data split fragments by splitting the set of data, and generating a plurality of parity fragments by applying an erasure coding algorithm, and
wherein to generate the plurality of parity fragments, the data durability circuitry performs a plurality of strided read operations across the plurality of data split fragments, wherein the plurality of strided read operations includes reading, for each of the plurality of data split fragments, data at a stride offset relative to the beginning of each of the data split fragments,
store the plurality of data fragments on a network, wherein at least some of the plurality of data fragments is stored within a different fault domain on the network,
receive, from a requesting server, a request to access at least a portion of the set of data, wherein the requesting server is one of the plurality of servers,
determine that one or more of the plurality of data fragments is not available on the network,
identify a plurality of available data fragments, wherein the plurality of available data fragments is a subset of the plurality of data fragments,
retrieve each of the plurality of available data fragments over the network,
cause the data durability circuitry to generate a reconstructed set of data from the available data fragments, and
respond to the request by outputting the reconstructed data.

18. A computer-readable storage medium comprising instructions that, when executed, configure processing circuitry to:
cause data durability circuitry to generate, from a set of data, a plurality of data fragments, wherein generating the plurality of data fragments includes generating a plurality of data split fragments by splitting the set of data, and generating a plurality of parity fragments by applying an erasure coding algorithm, and
wherein generating the plurality of parity fragments includes performing a plurality of strided read operations across the plurality of data split fragments, wherein the plurality of strided read operations includes reading, for each of the plurality of data split fragments, data at a stride offset relative to the beginning of each of the data split fragments;
store the plurality of data fragments on a network, wherein at least some of the plurality of data fragments is stored within a different fault domain on the network;
receive, from a requesting server, a request to access at least a portion of the set of data, wherein the requesting server is one of the plurality of servers;
determine that one or more of the plurality of data fragments is not available on the network;
identify a plurality of available data fragments, wherein the plurality of available data fragments is a subset of the plurality of data fragments;
retrieve each of the plurality of available data fragments over the network,
cause the data durability circuitry to generate a reconstructed set of data from the available data fragments; and
respond to the request by outputting the reconstructed data.

* * * * *